(12) United States Patent
Gostein et al.

(10) Patent No.: US 8,773,021 B2
(45) Date of Patent: Jul. 8, 2014

(54) LIGHT SOAKING SYSTEM FOR PHOTOVOLTAIC MODULES

(75) Inventors: Michael Gostein, Austin, TX (US); Stan Faullin, Round Rock, TX (US); Lawrence R. Dunn, Austin, TX (US)

(73) Assignee: Atonometrics, LLC, Austin, TX (US)

( * ) Notice: Subject to any disclaimer, the term of this patent is extended or adjusted under 35 U.S.C. 154(b) by 135 days.

(21) Appl. No.: 13/503,704

(22) PCT Filed: Oct. 27, 2010

(86) PCT No.: PCT/US2010/054330
§ 371 (c)(1),
(2), (4) Date: Jul. 9, 2012

(87) PCT Pub. No.: WO2011/056672
PCT Pub. Date: May 12, 2011

(65) Prior Publication Data
US 2012/0274215 A1    Nov. 1, 2012

Related U.S. Application Data

(60) Provisional application No. 61/377,662, filed on Aug. 27, 2010, provisional application No. 61/255,752, filed on Oct. 28, 2009.

(51) Int. Cl.
*H02N 6/00* (2006.01)
*H01L 25/00* (2006.01)

(52) U.S. Cl.
USPC ............................................ 315/113; 136/246

(58) Field of Classification Search
USPC .................. 315/113, 151, 137, 130; 136/246; 257/200; 362/2; 250/504 R
See application file for complete search history.

(56) References Cited

U.S. PATENT DOCUMENTS

| | | | |
|---|---|---|---|
| 2,697,587 | A | 12/1954 | Conison |
| 3,169,213 | A | 2/1965 | Shaheen |
| 4,423,469 | A | 12/1983 | Zerlaut et al. |
| 4,512,333 | A | 4/1985 | King |
| 4,528,503 | A | 7/1985 | Cole |
| 4,924,096 | A | 5/1990 | Mroczkowski et al. |

(Continued)

FOREIGN PATENT DOCUMENTS

| JP | 2005-241487 | 9/2005 |
|---|---|---|
| JP | 2007-042999 | 2/2007 |

OTHER PUBLICATIONS

King, D. L., Hansen, B.R., Kratochivl, J.R., and Quintanra, M. A. Dark Current-Voltage Measurements on Photovoltaic Modules as a Diagnostic or Manufacturing Tool. IEEE Photovoltaic Specialists Conference, Sep. 1997. [retrieved on May 6, 2011]. Retrieved from the Internet: http://ieeexplore.ieee.org/xpUfreeabs_all.jsp?amumber=654286.

*Primary Examiner* — Daniel D Chang
(74) *Attorney, Agent, or Firm* — Hulsey Calhoun, PC; William N. Hulsey

(57) ABSTRACT

An apparatus for exposing photovoltaic (PV) modules to simulated sunlight for testing purposes, comprising a chamber including a plurality of lamps disposed on a substantially vertical lamp plane, at least one substantially vertical target plane upon which are disposed one or more PV modules, at least one reflector for directing light from the lamps to the at least one target plane, and a cooling system to exhaust heat from the apparatus and maintain the temperature of the PV modules at a predetermined value.

50 Claims, 15 Drawing Sheets

(56) References Cited

U.S. PATENT DOCUMENTS

| | | | |
|---|---|---|---|
| 5,206,518 A | 4/1993 | Fedor et al. | |
| 5,426,569 A | 6/1995 | Sopori | |
| 5,984,484 A | 11/1999 | Kruer | |
| 6,111,767 A | 8/2000 | Handleman | |
| 6,967,485 B1 | 11/2005 | Hsueh et al. | |
| 2002/0070703 A1 | 6/2002 | Allen | |
| 2002/0121298 A1 | 9/2002 | Konold | |
| 2005/0087768 A1 | 4/2005 | March et al. | |
| 2006/0162772 A1 | 7/2006 | Presher, Jr. et al. | |
| 2007/0034026 A1 | 2/2007 | Maciver et al. | |
| 2008/0106250 A1 | 5/2008 | Prior et al. | |
| 2008/0220712 A1 | 9/2008 | Hu | |
| 2009/0038668 A1 | 2/2009 | Plaisted | |
| 2009/0133735 A1 | 5/2009 | Yuguchi et al. | |
| 2009/0179651 A1 | 7/2009 | Elgar et al. | |
| 2009/0229667 A1 | 9/2009 | Shrotriya et al. | |
| 2009/0261810 A1 | 10/2009 | Askins et al. | |
| 2010/0085670 A1 | 4/2010 | Palaniswami et al. | |
| 2011/0198509 A1* | 8/2011 | Gostein et al. | 250/372 |
| 2012/0053867 A1 | 3/2012 | Dunn et al. | |
| 2012/0274215 A1* | 11/2012 | Gostein et al. | 315/113 |

\* cited by examiner

LIGHT SOAKING SYSTEM FOR PHOTOVOLTAIC MODULES

RELATED APPLICATION DATA

The present application claims priority to U.S. Provisional Patent Application Ser. No. 61/255,752, filed Oct. 28, 2009; and U.S. Provisional Patent Application Ser. No. 61/377,662, filed Aug. 27, 2010, which are incorporated herein by reference.

FIELD OF THE INVENTION

The invention relates to an apparatus for testing solar panels, also known as photovoltaic (PV) modules, by exposure to steady-state simulated sunlight.

BACKGROUND OF THE INVENTION

Photovoltaic modules are used in solar energy systems for converting sunlight to electricity. Manufacturers and testing centers routinely test PV module products to determine their performance characteristics and power output.

Laboratory-based indoor testing of PV modules requires a solar simulator apparatus that can expose a module to simulated sunlight. Many tests are performed with a pulsed or "flash" tester, which exposes a test module to a brief flash of light and measures the module's current versus voltage relationship ("I-V curve") during the short duration of the flash. However, other tests require steady-state simulators, which provide continuous light exposure over longer durations. Various tests requiring steady-state solar simulators are described, for example, in International Electrotechnical Commission (IEC) standards 61215 and 61646, which are widely adopted in the PV industry.

It is known that the performance characteristics of PV modules may change upon continuous exposure to sunlight, particularly for "thin-film" PV technologies such as those based on amorphous silicon, CIGS, CdTe, or organic materials. Light-induced variations include both short-term effects, which may either improve or degrade performance, and long-term effects, which generally cause slow degradation. Therefore, in order to accurately assess PV module performance, manufacturers and testing centers may subject test modules to continuous light exposure for sustained periods. This is referred to as "light soaking" Light soaking durations vary widely depending on application, but can be up to hundreds of hours for module stabilization tests such as described in IEC 61646.

An apparatus used for light soaking is, generally, a form of a steady-state solar simulator. Typically, however, the specifications of an apparatus used for light soaking purposes will differ from those of a steady-state solar simulator used, for example, for I-V testing, due to the differences in the intended applications.

Various types of equipment are in use for light soaking. The simplest equipment uses bright lamps arranged over a horizontal test bed where the module is placed. In some cases lamps are arranged in a vertical plane and illuminate a vertically oriented test module. Such free-standing lamp systems are typically operated in a dedicated room or enclosed area, due to the need for eye protection when working near the lamps. Recently, light soaking chambers have been developed which completely enclose the lamps and test modules.

Existing light soaking systems have a number of shortcomings, particularly for applications where many modules must be tested. Free-standing arrays of lamps, as already noted, require dedicated rooms or enclosed areas, and therefore use significant floor space per tested module—particularly for horizontally oriented test beds. Furthermore, such systems are generally energy inefficient, since the lamps typically illuminate an area much larger than the test module in order to achieve uniform illumination over the area of the module. While chamber-based systems have several advantages versus free-standing arrays of lamps, existing light soaking chambers are based on horizontal test bed designs, and therefore occupy significant floor space per tested module. Furthermore, controlling the temperature and the temperature uniformity of the tested modules is difficult with existing systems, particularly if the module temperature is to be adjusted over a wide range for different test purposes.

In view of the above shortcomings of existing light soaking systems, there is a need for an improved light soaking apparatus for PV modules.

BRIEF SUMMARY OF THE INVENTION

The disclosed subject matter provides an apparatus for exposing photovoltaic (PV) modules to simulated sunlight in order to conduct "light soaking" for module testing. It is an object of the disclosed subject matter to provide an apparatus that minimizes the required floor space per tested module, as well as the capital and operating cost of the apparatus. It is a further object of the disclosed subject matter to allow the light intensity and temperature of the modules to be varied over wide ranges, while maintaining acceptable temperature uniformity.

In addition, it is an object of the disclosed subject matter to integrate electronic test capabilities with the light soaking function, and to provide for the automatic sequencing of various illumination, temperature, and electrical test conditions.

The apparatus comprises a chamber 300 including an array of lamps 310 disposed on a substantially vertically oriented lamp plane 312; at least one substantially vertically oriented target plane 330 for placing at least one PV module, which is referred to as a device under test (DUT) 340, wherein the PV module is placed so that its front-side active area faces the lamps 310; and at least one reflector (322, 324, 326) for directing light to the at least one target plane 330.

In one embodiment, the apparatus includes two target planes 330, one on each side of the lamp plane 312.

The apparatus additionally includes a cooling system to maintain the temperature of the DUT module(s) 340 on the target plane(s) 330. The cooling system directs air onto each DUT module 340.

In one group of embodiments, the DUT(s) 340 are cooled by air flowing vertically within the chamber 300.

In one embodiment, cooling air is drawn through bottom vents 500 by fans (512a, 513) which exhaust heated air at the top of the apparatus. Glass panels 516 in front of each target plane 330 divide the chamber 300 into an inner lamp chamber and two outer DUT chambers. Cooling air flows between the DUT(s) 340 and the glass panels 516, cooling the DUT(s) from their front sides. In another embodiment, recirculation valves 514 permit heated air from the lamp chamber to mix with cool outside air. The settings of the recirculation valves 514 determine the proportion of cool outside air versus heated air that is admitted to the area of the DUT(s) 340. The cooling air is thereby pre-heated to a temperature somewhat below the DUT 340 target temperature, which allows the air flow rate to be maintained at a high level. This provides improved temperature uniformity of the DUT(s) 340, particularly at elevated temperatures. In another embodiment, glass panels 516 are omitted and cooling air is drawn across the back sides of the DUT(s) 340 between the DUT(s) 340 and the doors 350.

In another embodiment, cooling air is drawn down through top vents 501, flows downward across the DUT(s) 340, and is then exhausted at the top of the apparatus. The downward air flow direction counteracts the effects of convection currents and results in improved temperature uniformity, particularly at high temperatures.

In another group of embodiments, the back sides of the DUT(s) 340 are cooled by air entering the sides of the apparatus.

In one embodiment, fans 510 at the top and/or bottom of the chamber push hot air out of the chamber, causing cool air to be drawn into the chamber through side vents 480 located behind each DUT 340, thereby cooling the DUT(s) 340 by contact with the incoming air. The size, shape, position, or number of incoming air vents may be arranged to provide non-uniform air flow at the back side of each DUT 340 in order to compensate for other non-uniformities in the system, such as vertical chamber air temperature gradients, in order to achieve more uniform DUT 340 temperatures. Optionally, the vent pattern may be adjusted either by the user or under automatic control, for example by moveable screens, in order to optimize cooling and DUT 340 temperature uniformity over a range of operating conditions.

In another embodiment, the DUT(s) 340 are cooled by side fans 511 located behind each DUT module 340, which draw cool air through vents and expel the cool air against the DUT(s) 340. The size, position, or number of side fans 511 may be arranged to provide non-uniform air flow at the DUT (s) 340 in order to compensate for other non-uniformities in the system, such as vertical chamber air temperature gradients, in order to achieve more uniform DUT 340 temperatures. Optionally, the speeds of the side fans 511 can be adjusted, either manually or under automatic control, in order to optimize cooling and DUT 340 temperature uniformity over a range of operating conditions.

The apparatus additionally includes at least one temperature sensor 550 to measure the temperature of at least one DUT 340. Preferably, at least one temperature of each DUT 340 is measured.

The apparatus may additionally include light sensors 552 for measuring the intensity of the light reaching the target plane(s) 330. The light sensors 552 include a light sensitive device, such as a photodiode, which is calibrated against a reference device. Preferably, the light sensors 552 also include a temperature measurement device, and the calibrated reading of the light sensitive device is adjusted according to the measured temperature of the light sensor 552 to compensate for temperature induced variations.

In one embodiment, the apparatus additionally includes an electrical load for each DUT module 340 to dissipate power generated by the module. The load may be a resistor, an electronic load, or a maximum power-point tracking electronic load.

In another embodiment, the apparatus could additionally include I-V electronics 610 for measuring the I-V curve of each DUT module 340.

The apparatus could additionally include a computer system 600, which controls operation of the apparatus, logs data collected by sensors and measurement electronics, and provides for sequencing of test conditions.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims filed later.

BRIEF DESCRIPTIONS OF THE DRAWINGS

The novel features believed characteristic of the disclosed subject matter will be set forth in the claims. The disclosed subject matter itself, however, as well as a preferred mode of use, further objectives, and advantages thereof, will best be understood by reference to the following detailed description of illustrative embodiments when read in conjunction with the accompanying drawings, wherein:

In the figures, like elements should be understood to represent like elements, even though reference labels are omitted on some instances of a repeated element, for simplicity.

DETAILED DESCRIPTION OF ILLUSTRATIVE EMBODIMENTS

Figure 1:
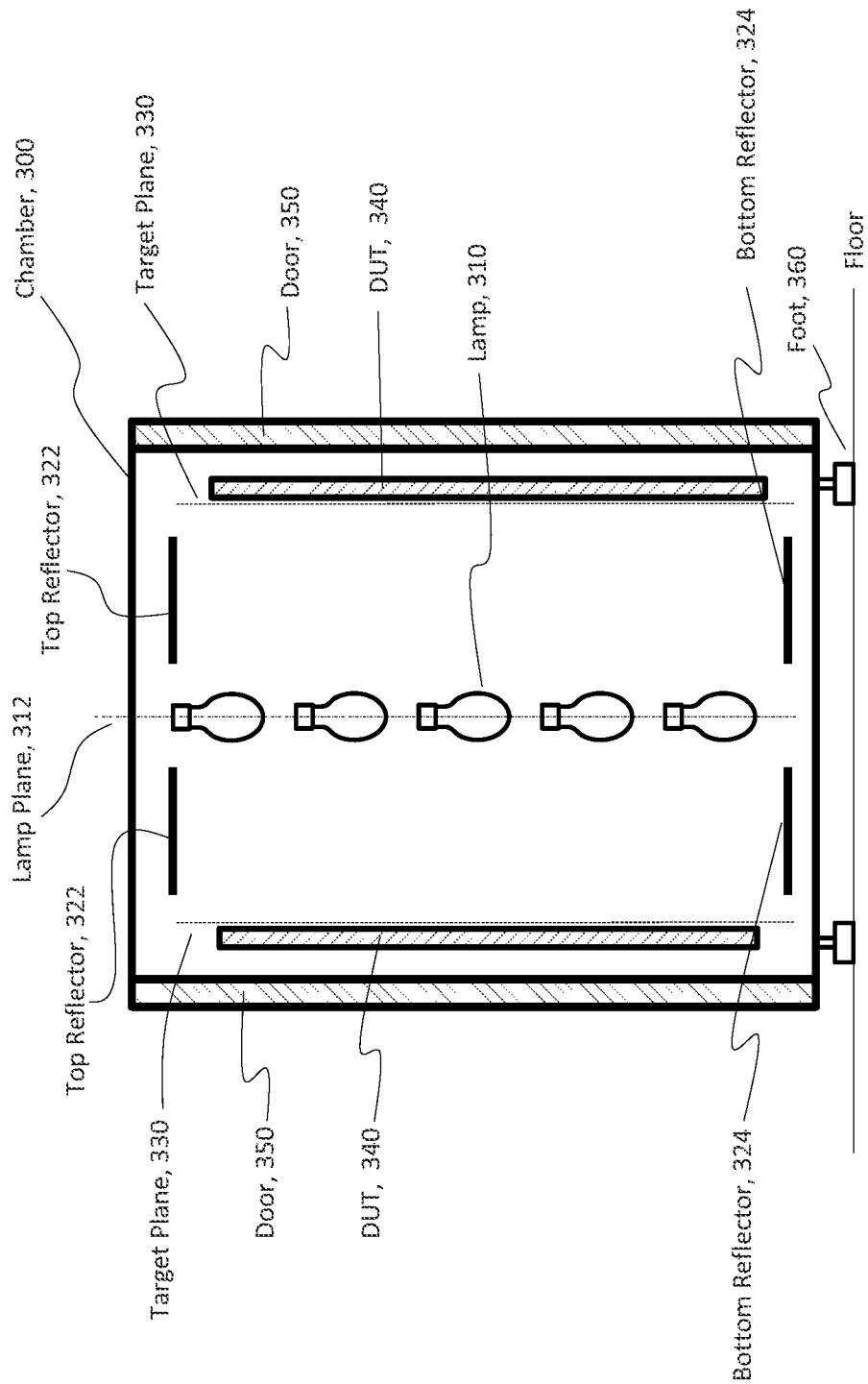
FIG. 1 depicts a side-view cross-section of elements of an apparatus according to the disclosed subject matter.

Although described with particular reference to a light soaking system for photovoltaic modules, those with skill in the arts will recognize that the disclosed embodiments have relevance to a wide variety of areas in addition to those specific examples described below.

All references, including publications, patent applications, and patents, cited herein are hereby incorporated by reference to the same extent as if each reference were individually and specifically indicated to be incorporated by reference and were set forth in its entirety herein.

Desired Operating Parameters

Evaluation of PV modules is typically performed with light intensities on the order of ~1000 W/m$^2$. IEC 61646, for example, specifies light intensity of at least 600 W/m$^2$ and up to 1000 W/m$^2$ for a light soaking test. For some test purposes, higher light intensity is desired, in order to accelerate light-induced changes in the device under test. Therefore, for the disclosed subject matter, it is preferred to have illumination in the range of ~750-1250 W/m$^2$, or even up to ~1500 W/m$^2$ or down to ~600 W/m$^2$; however, other intensities could be employed and remain within the scope of this disclosure. Preferably, the illumination intensity is adjustable, to allow the user to access a range of test conditions.

The light uniformity and solar spectral match of the invented apparatus may be classified according to the standards used for steady-state solar simulators, which are described, for example, in IEC 60904-9. With reference to these standards, for the invented apparatus it is advisable to have illumination uniformity of at least class C, corresponding to better than +/−10%, or preferably even class B, corresponding to better than +/−5%. It is also advisable to have a solar spectral match of at least class C, or preferably even class B, again with reference to the definitions of IEC 60904-9.

The effects of light soaking upon PV module characteristics typically depend not only on illumination intensity but also on module temperature. Therefore, an apparatus according to the disclosed subject matter should control the DUT 340 temperature within a suitable range. IEC 61646, for example, specifies that light soaking is to be performed at ~50 C, which is near the typical normal operating cell temperature (NOCT) of many PV modules. However, for some tests it is desirable to maintain the DUT temperature at a higher value, e.g. up to 85 C, which is near the maximum operating temperature of many PV modules. For other tests, lower temperatures are desired, e.g. down to 25 C, which is a standard test condition (STC) for reporting PV module performance according e.g. to IEC 61215 or 61646. Therefore, an apparatus according to the disclosed subject matter preferably allows temperature control over a range from ~20 C to 85 C; however, other temperatures could be employed and remain within the scope of this disclosure.

Significantly, the uniformity of the DUT 340 temperature should also be maintained. Preferably, the DUT 340 temperature uniformity in the apparatus will be better than +/−10 C, or even +/−5 C.

General Layout

Figure 2:
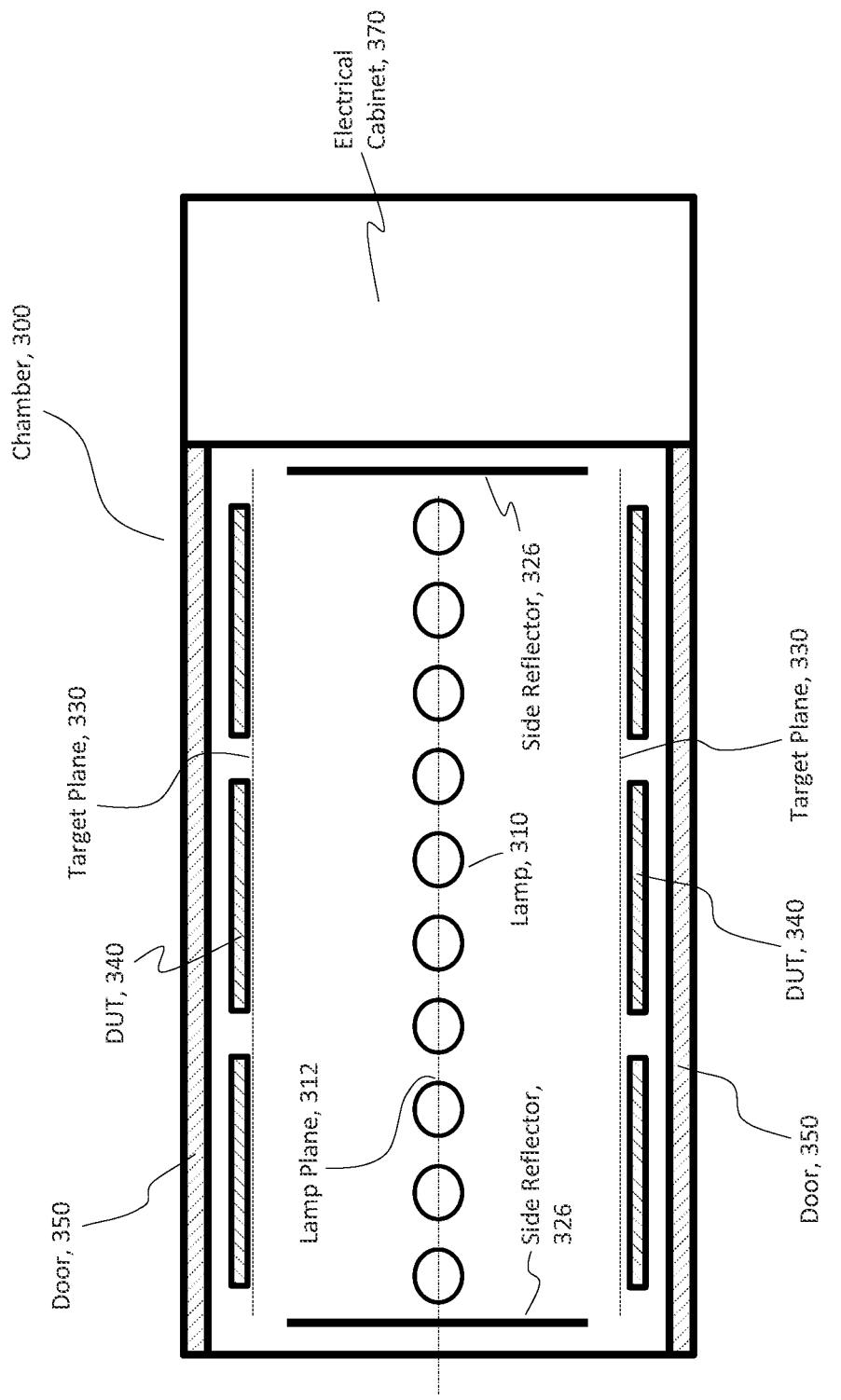
FIG. 2 depicts a top-view cross-section of elements of an apparatus according to the disclosed subject matter.

FIG. 1 and FIG. 2 depict elements of an apparatus according to the disclosed subject matter, with FIG. 1 providing a side-view cross-section and FIG. 2 providing a top-view cross-section. A chamber 300 houses an array of lamps 310 disposed on a vertically oriented lamp plane 312. The lamps illuminate at least one vertically oriented target plane 330 upon which is disposed at least one DUT module 340. Light from the lamps 310 is directed to the target plane(s) 330 by top, bottom, and side reflectors (322, 324, 326). DUT modules 340 are loaded into the chamber 300 through doors 350 in the chamber sides. The chamber typically rests on the floor and is supported, for example, on feet 360 or casters. An electrical cabinet 370 contains power and control electronics to operate the chamber 300, as well as a control computer 600 (not shown) and electronics to operate sensors and other measurement devices.

The vertical orientation of the lamp plane 312 and target plane(s) 330 allows the apparatus to occupy less floor space per tested module than an apparatus arranged with a horizontal test bed.

In one embodiment the apparatus contains two target planes 330, one on each side of the lamp plane 312, as depicted in FIG. 1 and FIG. 2, while in an alternative embodiment the apparatus contains a single target plane 330 on one side of the lamp plane 312. In the latter case the apparatus may also contain a back-reflector (not shown) on the side opposite the single target plane 330 to direct light to the target plane 330, greatly increasing the light intensity. In another embodiment, the apparatus contains two target planes 330, but a back-reflector (not shown) is integrated into the doors 350 on one or both sides of the chamber, or the interiors of the doors 350 are painted or coated with a reflective material so that the doors serve as back-reflectors. In this embodiment, when DUT(s) 340 are loaded on one side of the chamber only, the light intensity is nearly doubled.

Exemplary Embodiment

Preferably, the light soaking apparatus accommodates multiple DUT modules 340 in order to provide for economical testing. In an exemplary embodiment, an apparatus according to the disclosed subject matter includes two target planes 330 on opposite sides of the lamp plane 312, wherein each target plane is ~1.68 m high and ~2.26 m wide. These dimensions allow the exemplary apparatus to accommodate up to six typical 70 W thin-film modules or up to four typical 200-300 W crystalline silicon modules. However, the disclosed subject matter is not limited to the disclosed dimensions and other dimensions could be employed and remain with the scope of this disclosure.

Illumination System

Lamps

Lamps 310 for the apparatus should be relatively energy efficient, since high power consumption levels are required to reach the desired light intensities. In addition, the lamps 310 should be capable of producing light with a solar spectral match of at least class C or preferably class B (referring to IEC 60904-9).

Suitable lamps 310 include high-intensity discharge (HID) arc lamps, such as mercury, metal halide, and xenon lamps; however, other lamps could be utilized.

In particular, 100-1000 W metal halide lamps are a convenient choice for the disclosed subject matter because they are widely available for general lighting applications. In addition, metal halide lamps are available in a variety of formulations providing different spectral intensity distributions, and several manufacturers produce lamps whose spectral intensity distributions provide a class B solar spectral match. Such lamps include, for example, the Natural White® (a registered trademark of Advanced Lighting Technologies, Inc.) series manufactured by Venture Lighting® (a registered trademark of Advanced Lighting Technologies, Inc.).

For an exemplary embodiment with two target planes 330 measuring ~1.68 m×~2.26 m, approximately seventy 400 W metal halide lamps are required to reach target plane 330 light intensities above 1250 W/m². In this exemplary embodiment, the lamps 310 may be arranged, for example, as 5 horizontal rows of 14 lamps 310 each. The total power consumption of the lamps 310 in this embodiment is approximately 25 kW, with >30% of this power converted to usable radiation incident on the target planes 330.

Lamp Arrangement

The lamps 310 are disposed substantially along the lamp plane 312 and are arranged in order to optimize light intensity and uniformity on the target plane(s) 330.

In one embodiment, the lamps 310 are spaced uniformly along a single plane, as depicted in FIG. 1 and FIG. 2. In alternative embodiments, the lamps 310 may be interdigitated or organized in multiple planes parallel to the lamp plane 312. In one embodiment, the lamps 310 may be spaced non-uniformly, for example such that the spacing of the lamps 310 near the edges of the lamp plane 312 is reduced, in order to increase light intensity near the edges of the target plane(s) 330.

The exact positions of the lamps are best determined using optical illumination modeling software, using methods known in the art.

Reflectors

Reflectors (322, 324, 326) direct light from the lamps 310 to the target plane(s) 330. Without the reflectors (322, 324, 326), the energy efficiency of an apparatus according to the disclosed subject matter would be significantly lower, since less of the light produced by the lamps 310 would reach the target plane(s) 330 and higher total input power would be required to reach the same light intensity levels. Furthermore, without the reflectors (322, 324, 326) it would be more difficult to achieve uniform light intensity at the target plane(s) 330, since the edges of the target plane(s) 330 would receive less light than the centers.

In one embodiment, the reflectors (322, 324, 326) are support panels covered with a highly reflective material. An example of a suitable reflective material is Anolux® (a registered trademark of Anomet, Inc.) MIRO reflective sheet produced by ALANOD Aluminium-Veredlung GmbH & Co. KG. This material has an average reflectance of >95% for visible light. However, in alternative embodiments other reflective materials and/or structures could be employed.

In an exemplary embodiment, the reflectors (322, 324, 326) are flat panels arranged perpendicular to the lamp plane 312, as illustrated in FIG. 1 and FIG. 2. In alternative embodiments, any of the reflectors (322, 324, 326) may also be curved panels and/or be disposed at an oblique angle to the lamp plane.

Reflector Arrangement

The shapes and positions of the reflectors (322, 324, 326) are chosen to optimize the light intensity and uniformity at the target plane(s) 330. The exact shapes and positions are best determined using optical illumination modeling software, using methods known in the art.

Figure 3:
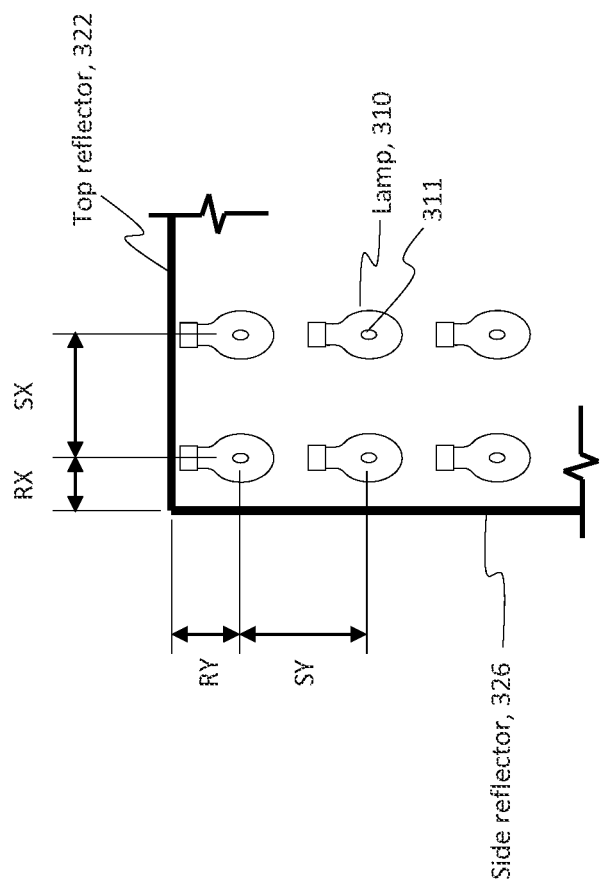
FIG. 3 depicts the relative spacing of lamps and reflectors.

In an exemplary embodiment, the reflectors (322, 324, 326) are flat panels perpendicular to the lamp plane 312. In this case, it is advantageous to position the reflectors (322, 324, 326) such that, with reference to FIG. 3, the distance RX from the initial or final vertical column of lamps 310 (as measured to the lamps' 310 light emitting portions 311) to a side reflector 326 is less than one-half the spacing SX between lamp columns, and the distance RY from the initial or final horizontal row of lamps 310 to a top or bottom reflector (322, 324) is less than one-half the spacing SY between lamp rows, in order to increase light intensity and improve uniformity near the edges of the target plane(s) 330. This can be understood by noting that in this case the optical image corresponding to the reflection of each edge lamp 310 from its nearest reflector (322, 324, 326) will be located within SX or SY, accordingly, of said edge lamp 310.

Ballasts

Ballasts for HID mercury, metal halide, and xenon arc lamps include both magnetic and electronic types. With a magnetic ballast, the output of a lamp 310 typically exhibits intensity oscillations (also known as "ripple" or "flicker") synchronous with the 50/60 Hz power line cycle. With an electronic ballast these intensity oscillations are suppressed (although not eliminated) by operating the lamp 310 at a high frequency.

Since it is an object of the disclosed subject matter to integrate DUT module 340 I-V curve measurements within the light soaking apparatus, electronic ballasts are preferred, in order to minimize the effects of light intensity variations during the measurements.

An additional advantage of using electronic ballasts is that they can provide dimming functions allowing lamp 310 power to be varied. This allows the apparatus to achieve varying light intensity levels at the target plane(s) 330. Furthermore, it allows for tuning of the apparatus to achieve desired light intensity uniformity at the target plane(s) 330, by adjustment of individual lamps 310 or groups of lamps 310.

Exemplary dimmable electronic ballasts for metal halide lamps include the "SmartHID" products manufactured by MetroLight, Inc. These ballasts include not only continuous dimming capabilities but also other useful control features, such as a digital communication interface, remote enable/disable, automatic restrike, timed warm-up, over-temperature protection, and power monitoring, the benefits of which for the disclosed subject matter will be apparent to one skilled in the art.

Spectral Impact of Lamp Dimming

Although the intensity of an HID lamp may be dimmed using an electronic ballast, the spectral intensity distribution of the lamp 310 typically will change as the operating power applied to the lamp 310 is reduced. For example, for one exemplary HID metal halide lamp type, spectral intensity distribution data provided by the lamp manufacturer shows that a class B solar spectral match is maintained only when lamp power is greater than approximately 70 percent of full power. Therefore, in the disclosed subject matter, the dimming ranges of the lamps 310 are carefully chosen so as to maintain the desired average solar spectral match for the light reaching the target plane(s) 330.

Lamp Intensity Pattern

In an exemplary embodiment, the desired lowest light intensity setting of the apparatus may correspond to only 40-60% of the full power setting. Accordingly, it may not be possible to achieve the lower portion of the desired light intensity range simply by setting all lamps 310 to a low dimming setting, while simultaneously maintaining desired solar spectral match, due to the effect of dimming on the lamps' 310 spectral intensity distribution. One solution is to achieve the lower light intensity levels by enabling only a portion of the lamps 310 in the lamp array, the enabled lamps 310 being selected so as to maintain uniformity at the target plane(s) 330. Alternatively, the lower effective power levels can be achieved by setting alternating lamps to lower and higher power levels, such that the average power level is in the desired range and so that, even though the spectral intensity distributions of individual lamps 310 at low dimming settings may not have the desired spectral match, the intensity-weighted average light intensity distribution at the target plane(s) 330 does maintain the desired spectral match.

Figure 4:
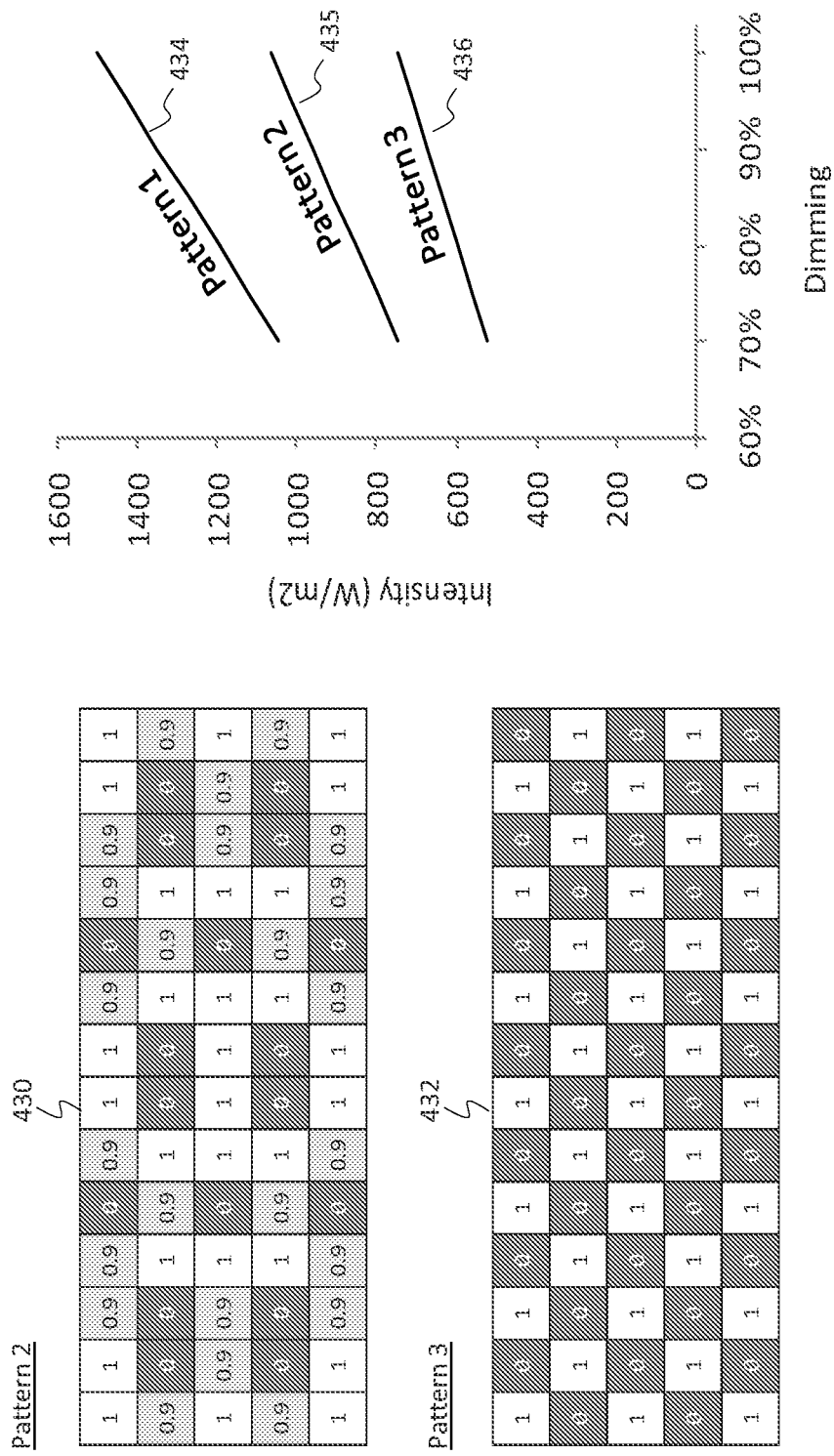
FIG. 4 depicts how varying light levels can be achieved on the target plane(s) by adjusting the pattern of lamp intensities and/or a dimming ratio applied to all lamps.

In one embodiment, as depicted in FIG. 4, light intensity is adjusted to within predetermined levels during operation of the apparatus by selecting a predetermined "lamp pattern" from within control software, wherein the lamp pattern designates which lamps 310 are enabled as well as relative intensity settings for each lamp 310. Within each pre-determined range, the intensity may be further adjusted using the dimming controls. FIG. 4 depicts an exemplary embodiment with 70 lamps 310 using 3 pre-determined lamp 310 patterns, wherein Pattern 1 (not shown) corresponds to all lamps 310 operating at 100% power, and Pattern 2 and Pattern 3 correspond to relative lamp 310 intensity factors as indicated in diagrams 430 and 432, respectively. Curves 434, 435, and 436, depict the intensity range achieved with each of the three exemplary lamp 310 patterns. The dimming range of each lamp 310 is selected in order to maintain the overall average solar spectral match of the light reaching the target plane(s) 330. The details of each lamp pattern may be determined, for example, using optical illumination modeling software.

Lamp Electrical Phase Assignments

As discussed previously, the use of electronic ballasts suppresses but may not eliminate light intensity oscillations synchronous with the power line cycle, which would be detrimental to I-V curve measurement. Therefore, in one embodiment, in order to further reduce light intensity oscillations at the target plane(s) 330, lamp ballasts 560 (not shown) are assigned to different phases of a conventional three-phase power system, such that intensity oscillations of the lamps 310 tend to cancel each other.

Figure 5:
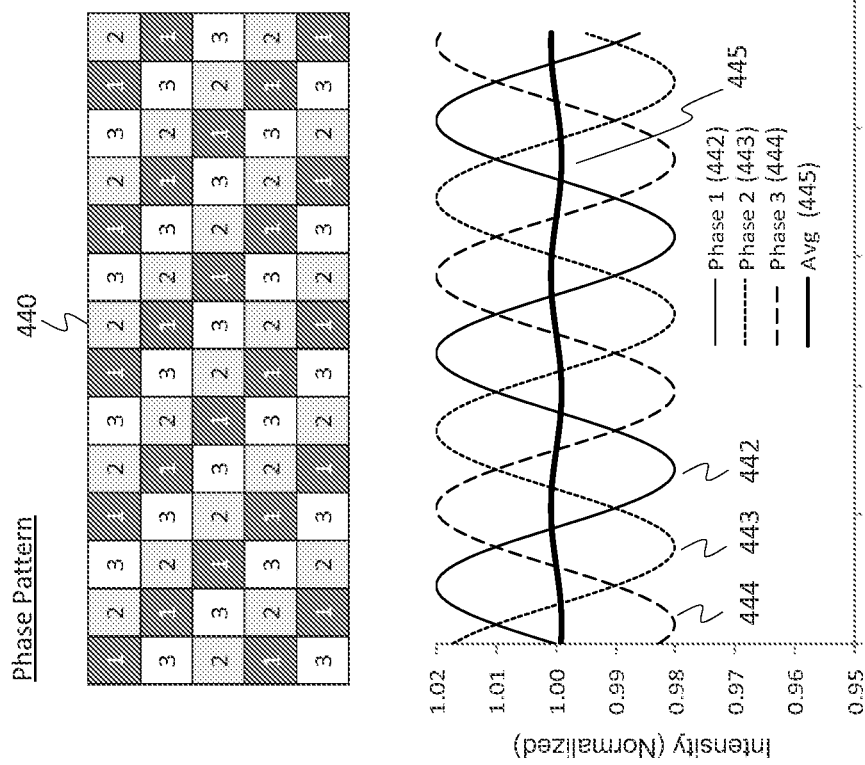
FIG. 5 depicts how the assignment of lamps to different phases of a three-phase power system can reduce the effect of residual power line cycle ripples in the lamp intensities.

This is depicted in FIG. 5, wherein diagram 440 illustrates an exemplary group of 70 lamps, each lamp being assigned to one of three phases, 1, 2, or 3, such that neighboring lamps tend to operate on multiple phases. The intensity output of three lamps operating on each of the different phases is depicted in curves 442, 443, and 444 for an exemplary case in which each lamp exhibits +/−2% intensity oscillations synchronous with the power line cycle. The light intensity received at each portion of the target plane(s) 330 will be an averaged mixture of these contributions, wherein the magnitude of oscillations will be greatly reduced, as depicted by curve 445.

Lamp Plane to Target Plane Distance

The distance between the lamp plane 312 and the target plane(s) 330 is chosen so as to both minimize the apparatus footprint (i.e. the floor space requirement) and optimize the light intensity and uniformity at the target plane(s) 330. The distance should be at least as large as the spacing between lamps 310 in the lamp plane 312, and preferably 2-4× this value, in order to minimize the intensity non-uniformity at the target plane(s) as well as to ensure adequate mixing of light from lamps powered by different phases of the power system.

Lamp Age Compensation

The light output of a lamp 310 typically degrades over time as a function of the number of hours of operation. For example, the light outputs of exemplary types of HID metal halide lamps typically degrade by approximately 10-25% after 5,000 hours of operation.

In one embodiment, in order to compensate for the degradation of lamp 310 output with lamp 310 age, and thereby optimize intensity and/or uniformity at the target plane(s) 330, the apparatus may automatically increase the output power of one or more lamps 310 using the dimming controls for the lamps' associated ballasts 560 (not shown). In one embodiment, the system uses stored data on the cumulative run-time of the lamps 310 to estimate correction factors to compensate for light output degradation. In another embodiment, the system measures light intensity using light sensors 552 (not shown), compares the measured intensity with a pre-determined target value, and automatically adjusts the ballast 560 dimming controls in order to maintain lamp 310 output within a pre-determined range.

Cooling System

The apparatus includes a cooling system, comprised of cooling fans and air vents, to remove heat generated by the lamps 310 and maintain the temperature of the DUT module (s) 340 on the target plane(s) 330.

In one group of embodiments, the flow of cooling air is substantially vertical within the chamber 300, and the DUT module(s) 340 are cooled either from their front or back sides.

In another group of embodiments, cooling air enters the apparatus through side vents (480, 480') and cools the DUT(s) 340 from their back sides.

Maintaining the temperature uniformity of the DUT(s) 340 within desired limits is challenging. As cooling air flows through the system, its temperature increases, and therefore regions of the DUT(s) 340 closer to the air inlets will generally be cooled to a lower temperature than regions near the air exhausts. Due to the large power dissipation of the system and the amount of cooling required, the induced air temperature gradient may be significant. In addition, as air flows through the system, the air flow velocity profile may change, resulting in variations in cooling effectiveness. Furthermore, even at low rates of forced air flow (such as used for higher temperature setpoints) the vertical orientation of the apparatus creates a tendency for a vertical air temperature gradient due to convection. It is an object of the disclosed subject matter to achieve uniform DUT 340 temperature profiles despite the foregoing challenges.

Vertical Cooling

Figure 6:
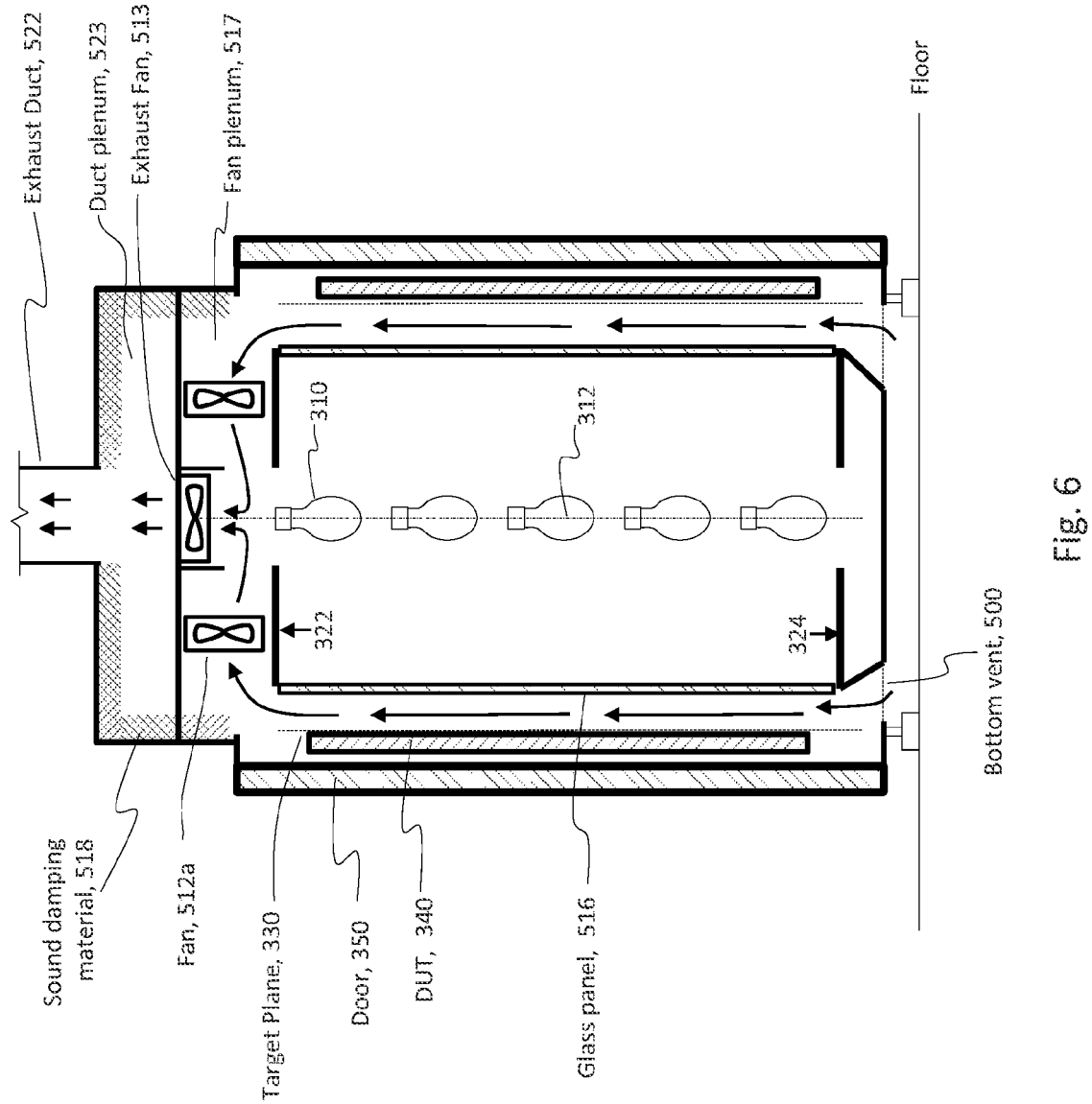
FIG. 6 depicts a side-view cross-section of an embodiment in which the DUT(s) are cooled by air flowing between the front sides of the DUT(s) and glass panels in front of each target plane, with cool air drawn in at the bottom of the apparatus and heated air exhausted at the top of the apparatus.
Figure 8:
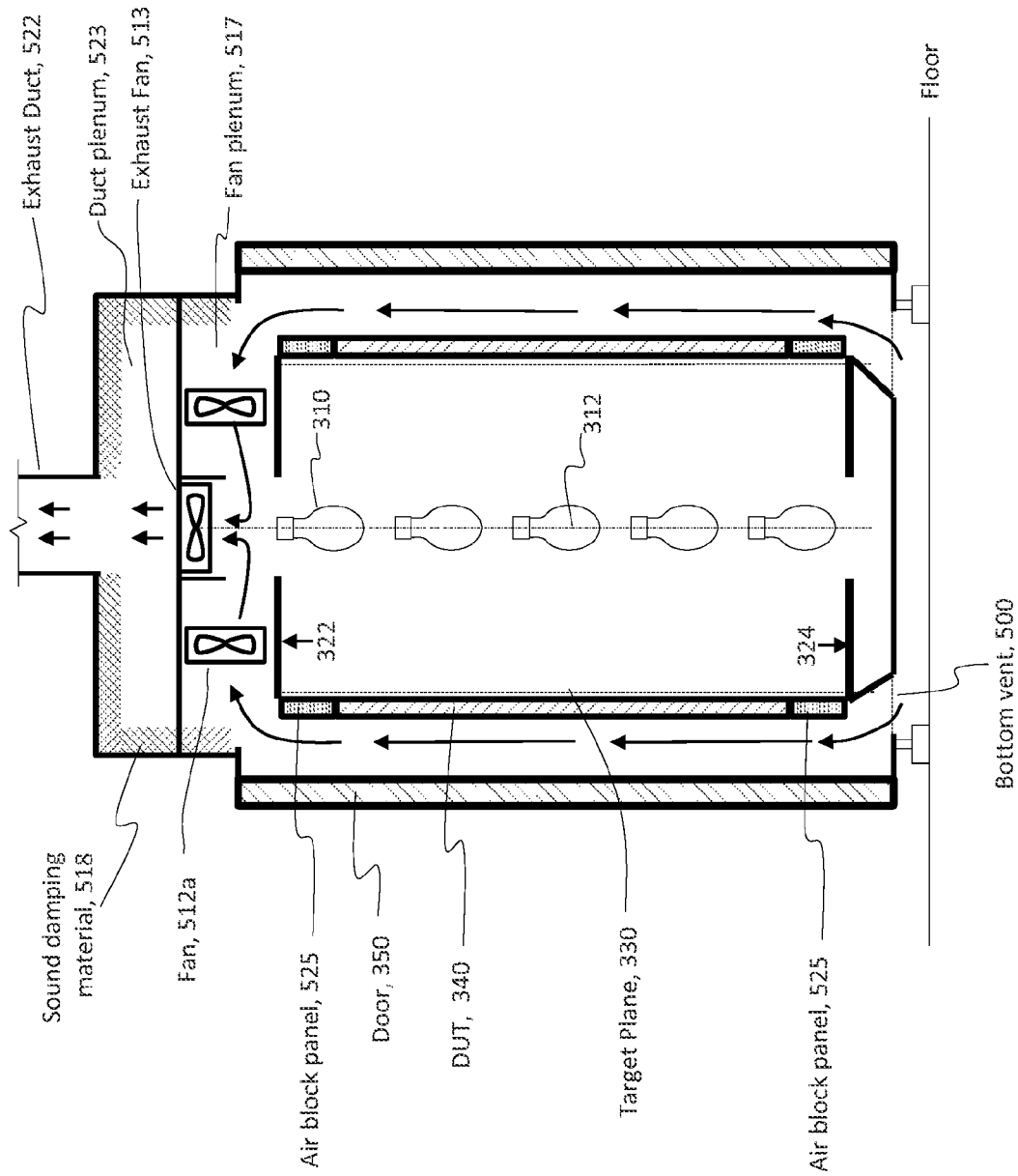
FIG. 8 depicts a side-view cross-section of an embodiment similar to that depicted in FIG. 6, in which the glass panels are omitted and cooling air flows along the back sides of the DUT(s) between the DUT(s) and the doors.

In one embodiment, depicted in FIG. 6, fans (512a, 513) at the top of the chamber 300 (and/or at the bottom of the chamber 300, not shown) push hot air out of the chamber, causing cool air to be drawn into the chamber through bottom vents 500, thereby cooling the DUT(s) 340 by contact with the incoming cool air. Additional vents, not shown, may be provided to cool other areas of the apparatus, such as lamps 310 and wiring in the lamp plane 312. The fans (512a, 513) may be contained within a fan plenum 517 at a point in the air stream beyond the top reflectors 322 (or bottom reflectors 324 if fans (not shown) are implemented at the bottom). A glass panel 516 in front of each target plane 330 effectively divides the chamber 300 into an inner lamp chamber and two outer DUT 340 chambers. Cooling air is drawn up across the DUT (s) 340 and cools the DUT(s) 340 from their front sides, facing the lamps 310. Air-blocking panels 525 (see FIG. 8) covering unused portions of the target plane 330 may be included in order to constrain air flow along the desired path. These confine the air flow within two smooth-walled surfaces, consisting of the glass panels 516 on one side and the DUT(s) 340 and air-blocking panels 525 on the other, in order to promote more uniform cooling.

Glass panels 516 are preferably made from glass having a high transmission coefficient across the spectral range of interest for the tests, such as any of a number of low-iron glass materials. An exemplary glass material is Starphire® (a registered trademark of PPG Industries Ohio, Inc.) glass manufactured by PPG Industries. The glass panels 516 may be treated with anti-reflection coatings and/or surface texturing in order to further improve transmission of the light to the DUT(s) 340.

In one embodiment, not shown, the tops of glass panels 516 are tilted towards the DUT(s) 340 on each side of the chamber 300, constricting the width of the air flow channels at the tops versus the bottoms. This increases the air flow velocity at the tops relative to the bottoms, increasing the cooling effectiveness at the tops and compensating for increased air temperature and other effects, leading to improved temperature uniformity of the DUT(s) 340.

Optionally, the heated exhaust air is removed through an exhaust duct 522 which may be connected to building air handling systems, wherein the exhaust duct 522 is optionally connected to the apparatus through a duct plenum 523. Optionally, the fan and/or duct plenums (517, 523) are lined with sound-absorbing material 518. The use of a duct 522 to remove expelled air has several benefits as compared to expelling the air into the environment directly surrounding the apparatus, including: removing heat from the area of the apparatus and thereby maintaining ambient air temperature; increasing the overall air flow through the system due to the pressure drop created by the building air handling system; and blocking noise generated by the fans (512a, 513).

Figure 7:
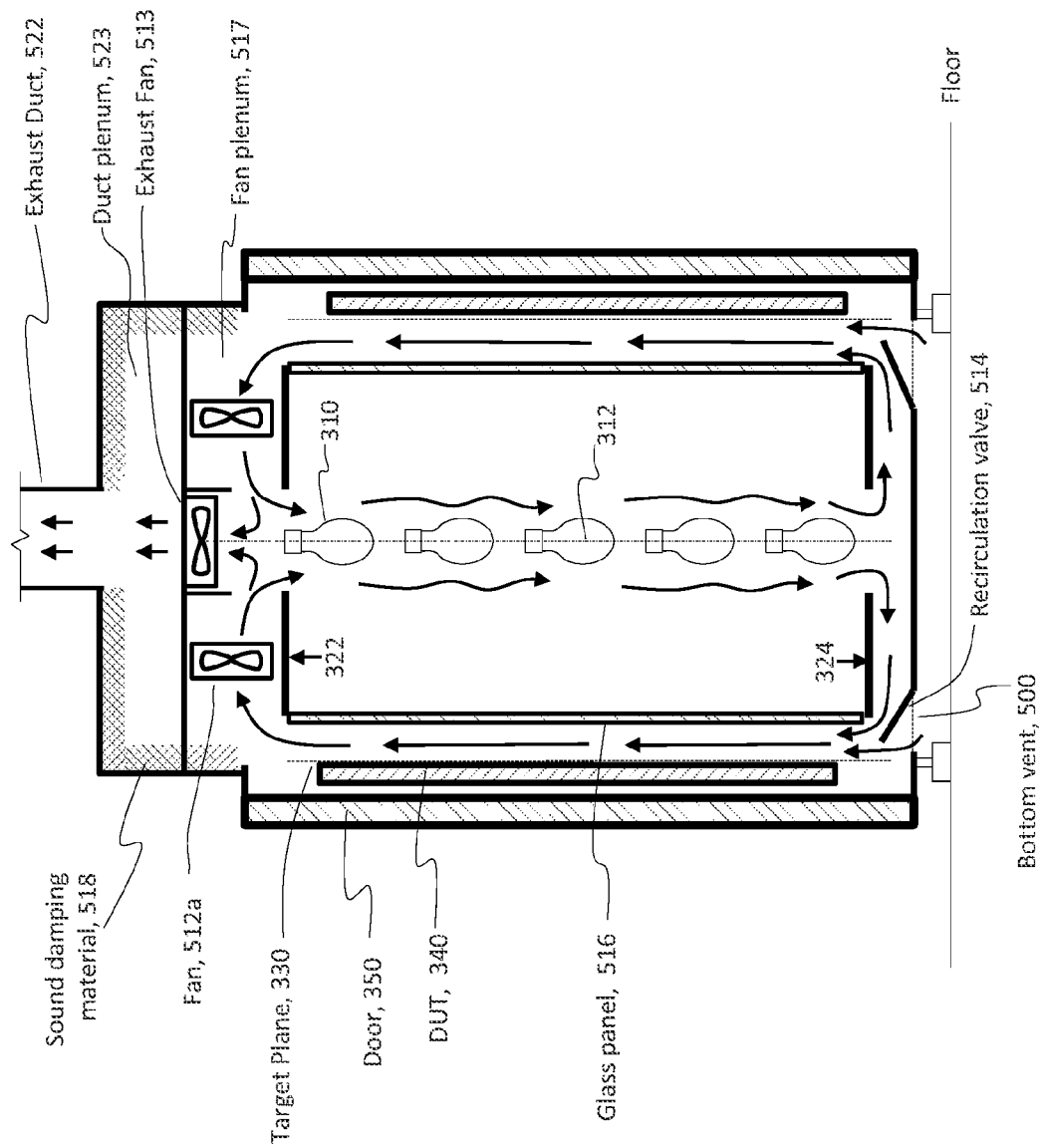
FIG. 7 depicts a side-view cross-section of an embodiment similar to that depicted in FIG. 6, further comprising a recirculation valve that permits heated air to be recirculated to the DUT areas in order to raise the temperature of the cooling air in contact with the DUT(s).

In another embodiment, depicted in FIG. 7, DUT(s) 340 are cooled using a mixture of cool outside air and heated air recirculated through the chamber. This provides improved temperature uniformity of the DUT(s) 340, particularly at elevated temperatures. Cool outside air is drawn through bottom vents 500 where it mixes with heated air drawn from the chamber past recirculation valves 514. The positions of recirculation valves 514 determine the proportion of cool outside air versus heated air that is admitted to the area of the DUT(s) 340. Fans 512a draw the mixed air past the DUT(s) 340 and pressurize the fan plenum 517. Exhaust fans 513 expel some of the heated air outside the chamber or into the optional duct plenum 523. A portion of the heated air in the fan plenum 517 is drawn back through the chamber to be mixed after passing through recirculation valves 514. Recirculation valves 514 may comprise, for example, panels actuated by electric motors or solenoids. Alternatively, they may comprise spring-loaded dampers that open when pressurized by a fan.

In one embodiment, recirculation valves 514 are arranged so that they may partially cover bottom vents 500, and their position is adjusted using associated actuators. At one extreme of the position range, only cool outside air is admitted to the area of the DUT(s) 340, while at the other extreme of the position range, only heated recirculated air is admitted to the DUT(s) 340. At intermediate positions, cool and heated air are mixed. The position of the recirculation valves 514 is chosen to obtain optimal cooling and temperature uniformity of the DUT(s) 340.

The preceding figures and discussion relate to embodiments in which the DUT(s) 340 are cooled from their front sides facing the lamp plane 312. In another embodiment, depicted in FIG. 8, DUT(s) 340 are cooled from their back sides. Air-blocking panels 525 fill the unused portions of the target planes 330 in order to separate the lamp chamber from the DUT cooling area. Cooling air is drawn across the backs of the DUT(s) 340, between the DUT(s) 340 and the doors 350.

Cooling the DUT(s) 340 from their front sides is advantageous for achieving more uniform air flow and therefore more uniform temperature profiles, due to junction boxes, cables, and/or supporting frames on the DUT 340 back sides, which tend to disrupt air flow. However, cooling from the back sides results in a lower apparatus cost and potentially higher light intensities at the target planes 330, due to the omission of the glass panels 516.

Figure 9:
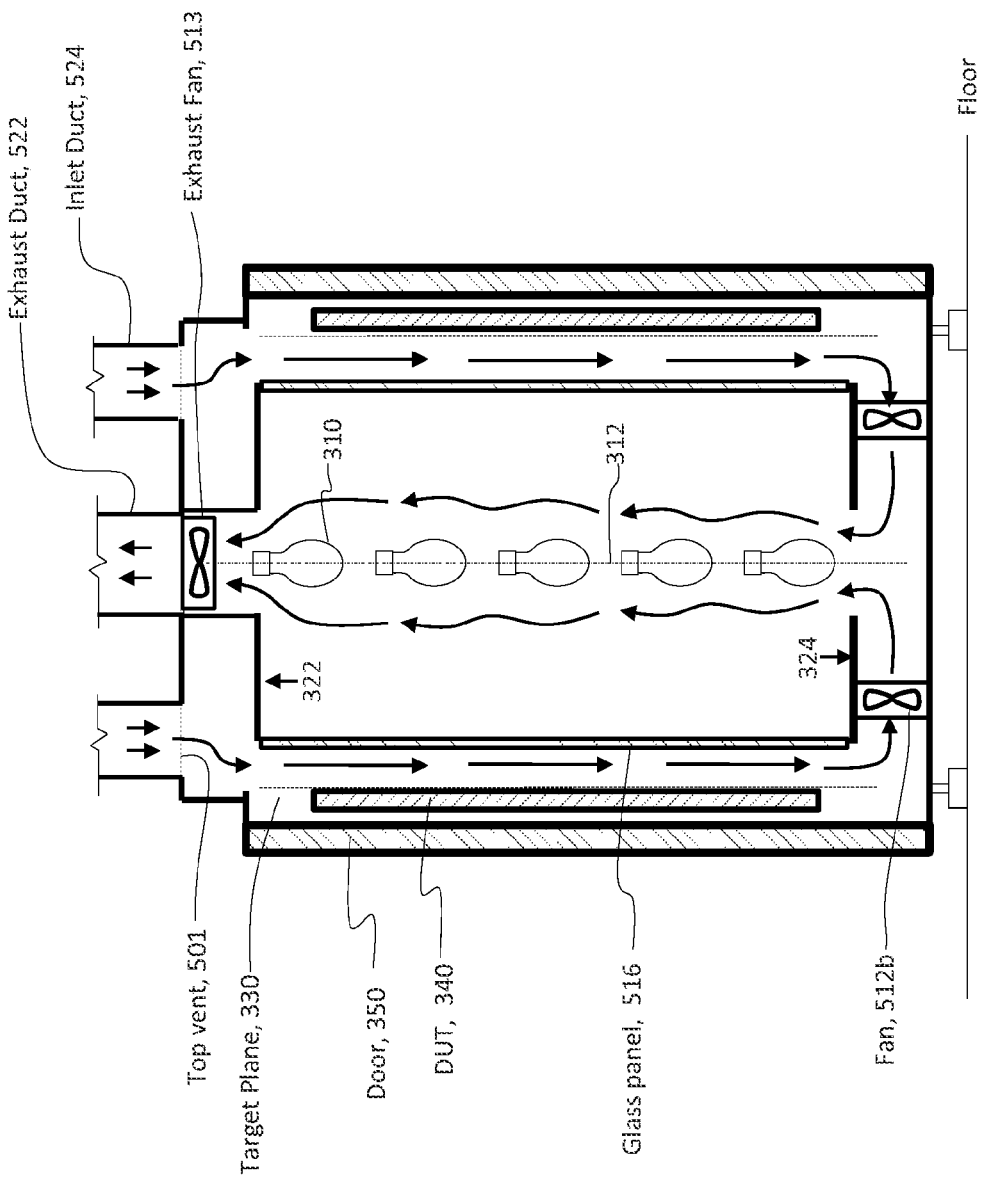
FIG. 9 depicts a side-view cross-section of an embodiment in which cooling air is drawn from vents at the top of the apparatus and the DUT(s) are cooled by air flowing downward.

In another embodiment, depicted in FIG. 9, cooling air is drawn down into the apparatus from top vents 501 by bottom fans 512b (and/or fans, not shown, beneath top vents 501), flows down past the DUT(s) 340, into the inner lamp chamber, and is then exhausted by exhaust fans 513. This embodiment is particularly advantageous for maintaining good temperature uniformity at high temperature setpoints, in the range of 60-85 C or above. For these high temperature setpoints, an upward draft of warm air naturally develops, in the absence of forced air cooling, due to convection, leading to temperatures up to 15-20 degrees higher at the tops of DUT(s) 340 versus the bottoms, depending on the DUT 340 size. Cooling the DUT(s) 340 with upward-directed cooling air can further increase this temperature difference, while cooling with downward-directed air, as in the presently discussed embodiment, tends to reduce the temperature gradient and lead to better uniformity. Optional inlet ducts 524 may be used to bring cold air to the apparatus from building air handling systems or from an external air chiller. Optional exhaust ducts 522 may be used to remove heated air from the vicinity of the apparatus.

Figure 10:
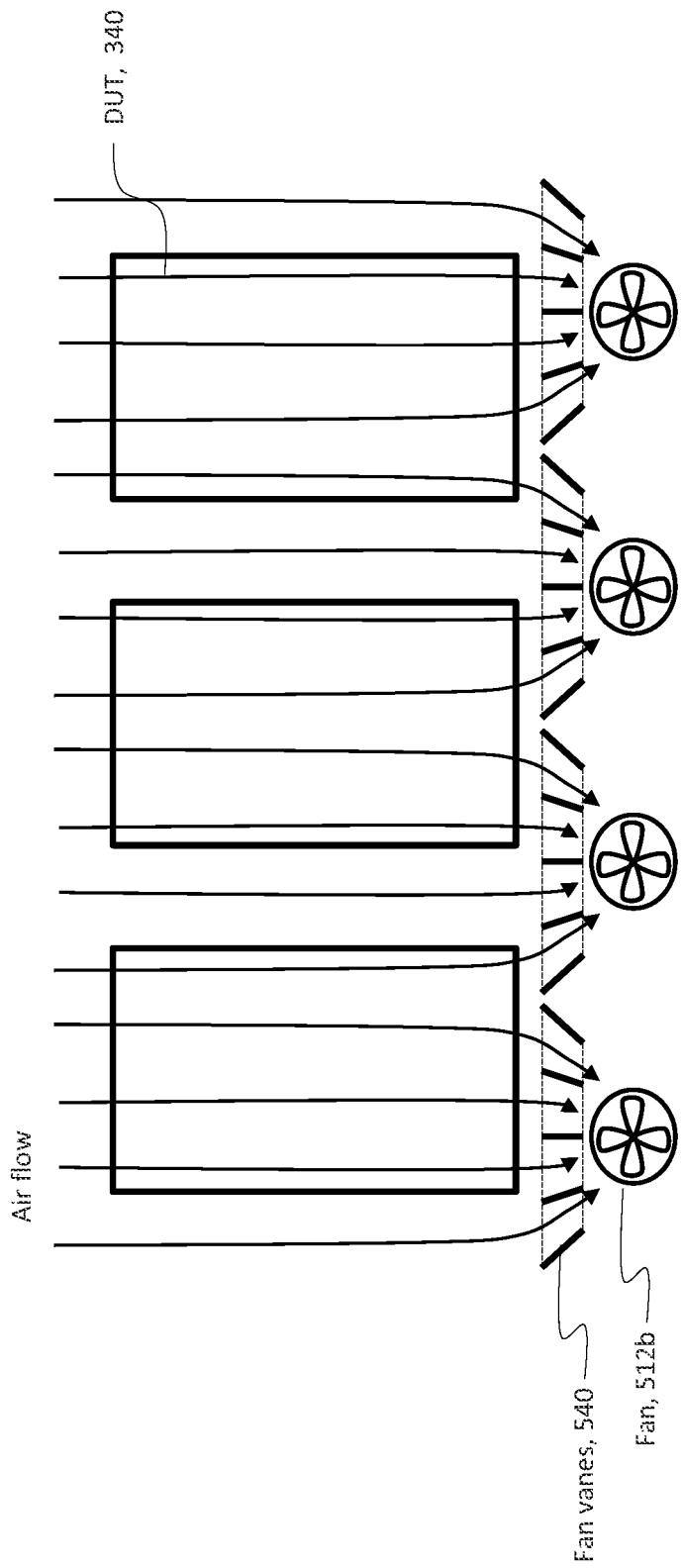
FIG. 10 depicts fan vanes which direct air to cooling fans in order to provide for more uniform air flow over the DUT(s).

FIG. 10 depicts elements of FIG. 9 viewed in a cross-section plane parallel to one of the target planes 330. It will be apparent that the distribution of air flow may be non-uniform as air flow lines tend to concentrate near the fans 512b. The distribution of air flow may be made more uniform by providing for a plenum area between the DUT(s) 340 and fans 512b. Alternatively, or in addition to the use of a plenum area, a system of fan vanes 540 may be used to direct air uniformly into the fans 512b, as depicted in FIG. 10. (The same principle may be applied to any of the previously discussed embodiments.)

In all of the foregoing embodiments, a temperature gradient typically develops across the DUT(s) 340, with temperatures typically lower near the end of the DUT(s) 340 first encountered by the cooling air. In one embodiment, DUT 340 temperature gradients are reduced by periodically alternating the direction of air flow across the DUT(s) 340, so that the effects of cooling non-uniformities are averaged. This may be achieved, for example, by reversing the motion of the cooling fans, employing multiple cooling fans which are directed in different directions, or by using valves that change the direction of air flow within the system. Valves may be actuated, for example, by motors or solenoids, or may comprise spring-loaded dampers which open when fan air pressure is applied.

It will be apparent that a variety of other vertical cooling embodiments could be devised to accomplish substantially the same purposes as the exemplary embodiments described here.

Side Cooling

Figure 11:
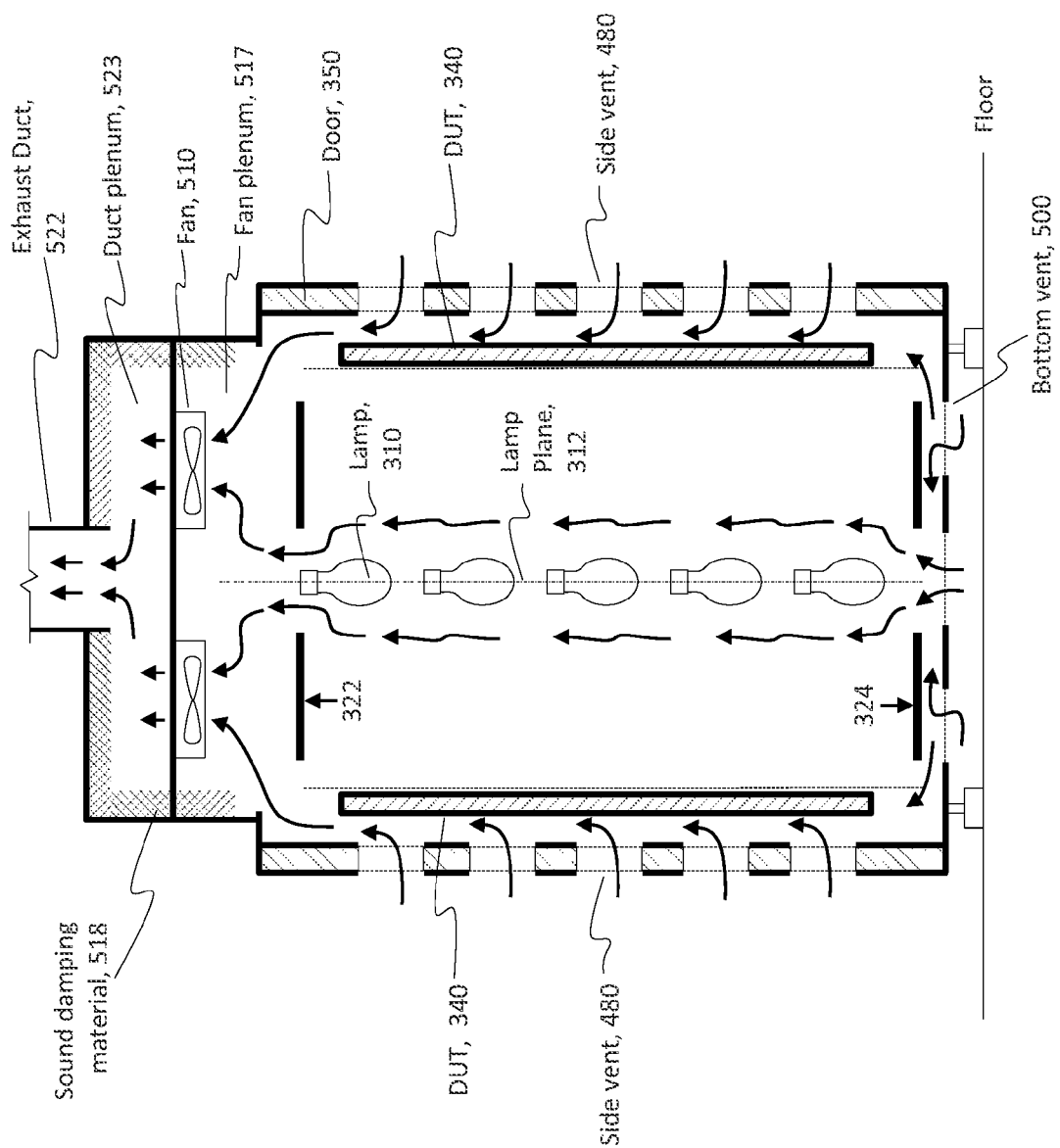
FIG. 11 depicts a side-view cross-section of an embodiment in which cooling air is drawn through vents in the sides of the apparatus and exhausted at the top, in such a manner that the air cools the back sides of the DUT(s).

In one embodiment, depicted in FIG. 11, fans 510 at the top (and/or bottom, not shown) of the chamber 300 push hot air out of the chamber, causing cool air to be drawn into the chamber through side vents 480 located behind each DUT 340, thereby cooling the DUT(s) 340 by contact with the incoming air. Additional vents such as bottom vents 500 may be provided to cool other areas of the apparatus, such as lamps 310 and wiring in the lamp plane 312. The fans 510 may be contained within a fan plenum 517 at a point in the air stream beyond the top reflectors 322 (or bottom reflectors 324).

Optionally, the heated expelled air is removed through a duct 522 connected to building air handling systems, wherein the duct 522 is optionally connected to the apparatus through a duct plenum 523. Optionally, the fan and/or duct plenums (517, 523) are lined with sound-absorbing material 518.

In order to compensate for temperature gradients and maintain temperature uniformity of the DUT(s) 340, in one embodiment, the size, shape, position, and/or number of side vents 480 are arranged to provide non-uniform air flow at the back side of each DUT 340. For example, the air flow may be increased towards the top of each DUT 340 in order to compensate for vertically increasing internal air temperatures of the apparatus. The optimal pattern of side vents 480 may depend on the setpoint temperature to which DUT(s) 340 are to be controlled. Therefore, optionally, the vent pattern may be adjusted, for example by moveable screens, either manually or by automatic control, in order to optimize cooling and DUT 340 temperature uniformity over a range of operating conditions.

Figure 12:
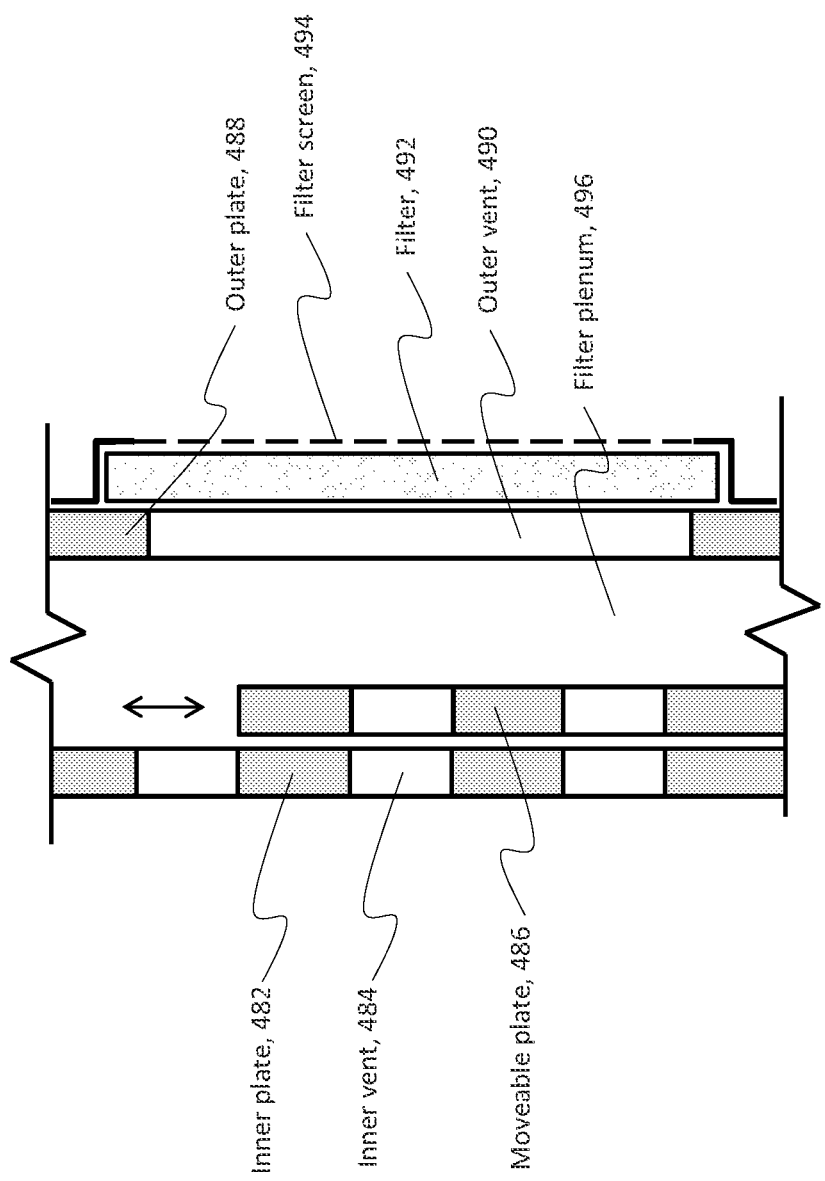
FIG. 12 depicts a detailed cross section of a door or chamber side in one embodiment, including inner and outer vents, a moveable plate, and an air filter.

FIG. 12 depicts one embodiment of the side vent system in greater detail. The figure depicts a cross section of the side vents 480 contained, for example, within a door 350. Air enters through an optional air filter 492 which is retained by a filter screen 494, passes through outer vent 490 cut into outer plate 488, and then passes into a filter plenum area 496 contained within a side or door 350 of the apparatus. Air then passes through holes in an optional moveable plate 486 and enters the chamber 300 through inner vents 484 cut into inner plate 482. The total cross-sectional area of outer vents 490 is chosen to be preferably at least twice the total cross-sectional area of inner vents 484, in order to ensure that filters 494 provide only negligible restriction to the air flow compared to inner vents 484. Moveable plate 486 is adjusted, for example to predetermined positions, in order to restrict air flow through selected inner vents 484 and thereby modify the air flow pattern as needed to obtain DUT 340 temperature uniformity. Moveable plate 486 is connected to a mechanical actuator (not shown) that allows its position to be selected, either manually or by automatic control.

Figure 13:
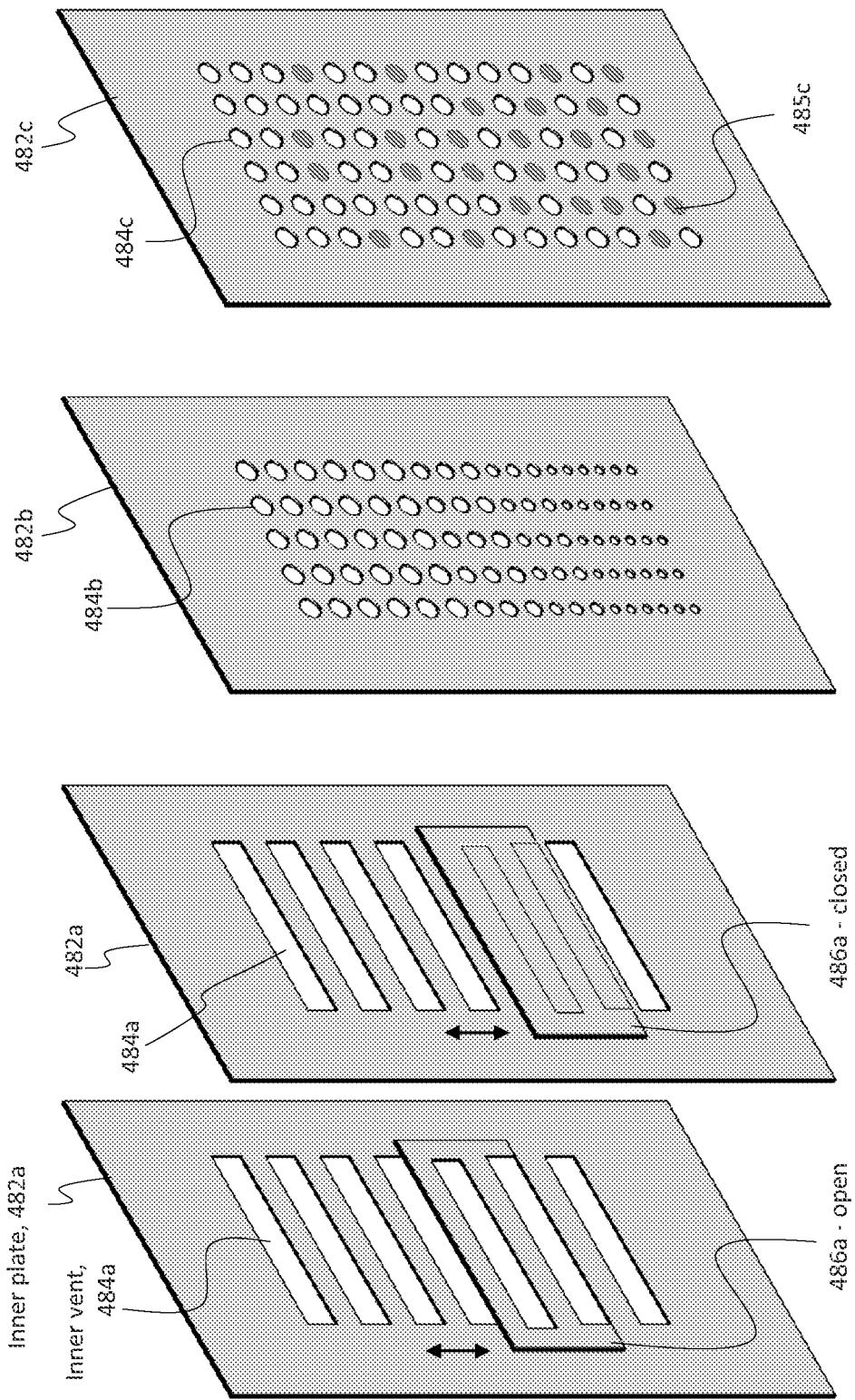
FIG. 13 depicts exemplary vent configurations and illustrates the use of a moveable plate to adjust the vent configuration.

FIG. 13 depicts exemplary profiles of inner vents 484. In an exemplary embodiment, inner plate 482a contains a series of horizontal inner vents 484a, a lower portion of which can be partially or fully obscured through adjustment of moveable plate 486a between "open", "closed", and, if necessary, partially open positions. In another exemplary embodiment, inner plate 482b contains a series of holes that form inner vents 484b, wherein the hole diameters vary with vertical position to achieve a non-uniform air flow pattern. A moveable plate (not shown) could also be used to modify the pattern. In yet another exemplary embodiment, inner plate 482c contains a series of holes that form inner vents 484c, wherein the holes may be selectively filled by plugs 485c, comprising, for example, metal or plastic caps, in order to modify the air flow pattern. Plugs 485c may be installed during system assembly or testing (among other times) in order to balance the temperature distribution of DUT(s) 340. Furthermore, plugs 485c may selectively contain smaller holes (not shown) which allow the air flow pattern to be further modified. A moveable plate (not shown) could also be used to further modify the pattern.

It will be apparent that a wide variety of other side vent 480 systems could be devised to accomplish substantially the same purposes as the exemplary systems described here.

Figure 14:
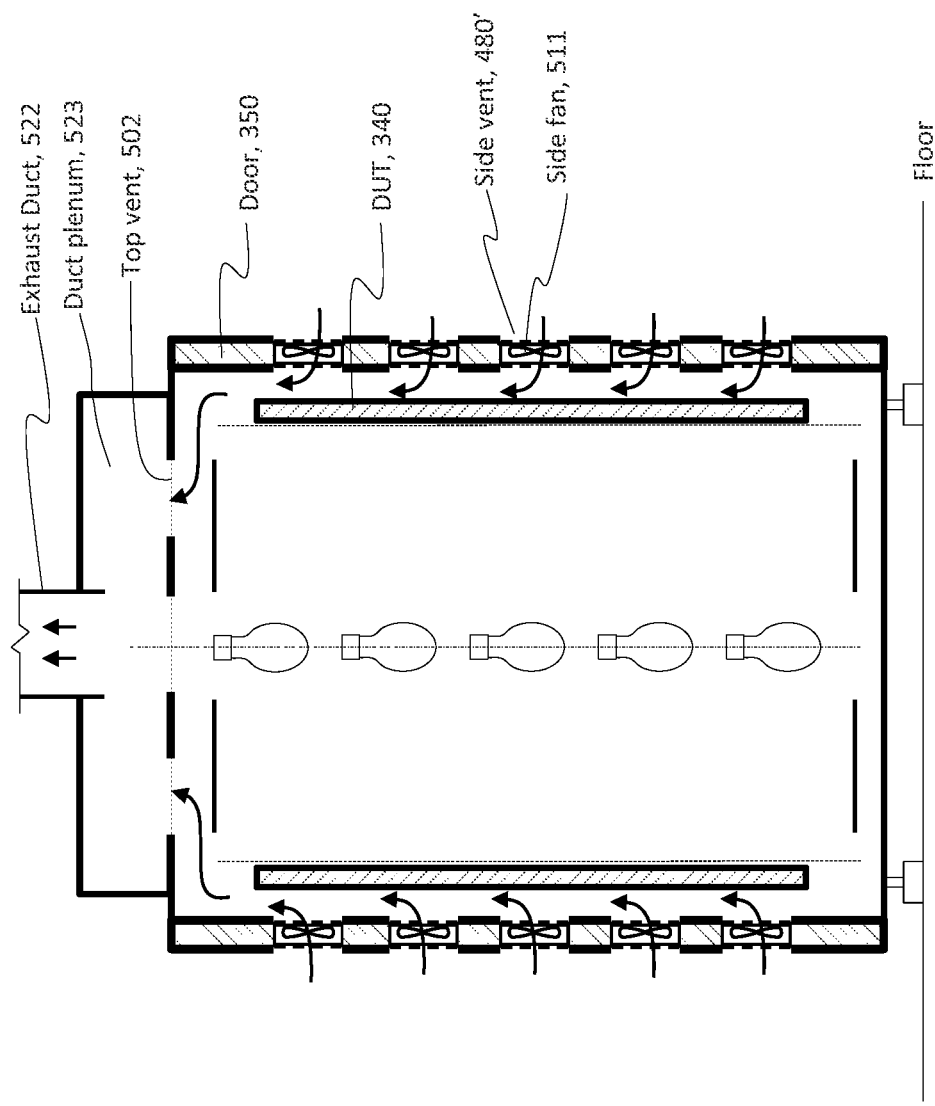
FIG. 14 depicts an embodiment with fans in the sides and/or doors.

In another embodiment, depicted in FIG. 14, the DUT(s) 340 are cooled by side fans 511 located behind each DUT, wherein the side fans 511 draw cool air through side vents 480' and expel the cool air against the DUT(s) 340. Air exits the chamber through top vents 502 (and/or bottom vents 500).

In order to compensate for internal temperature gradients and achieve uniform DUT 340 temperatures, the size, position, speed, and/or number of side fans 511 may be arranged to provide non-uniform air flow at the DUT(s) 340. For example, the fans 511 may be arranged to provide greater cooling at the top of each DUT 340 to compensate for vertically increasing internal chamber air temperatures. Non-uniform air flow may also be achieved by varying the shape or size of side vents 480' used in conjunction with side fans 511.

Optionally, the relative speeds of different side fans 511 can be adjusted during operation of the apparatus, either manually or under automatic control, in order to optimize cooling and DUT 340 temperature uniformity over a range of operating conditions. Adjustment of the relative speeds of different side fans 511 may also be used to compensate for temperature variations from one DUT 340 to another in a different position in the chamber, or to purposefully maintain different DUT(s) 340 at different temperatures.

In alternative embodiments, side fans 511 are used in conjunction with any of the other fan, vent, plenum, duct, or filter elements discussed in the preceding sections.

Temperature Sensors

An apparatus according to the disclosed subject matter may include at least one temperature sensor (not shown), such as a thermocouple, to measure the temperature of at least one DUT 340. Preferably, multiple temperature sensors (not shown) are included to measure at least one temperature of each DUT 340.

In one embodiment, temperature sensors 550 are integrated into doors 350 such that DUT 340 temperatures are automatically measured without requiring the system operator to attach the temperature sensors to the DUT(s) 340. This may be achieved, for example, by using infrared or other optical temperature measurement devices directed at the DUT 340 locations, or by attaching contact temperature measurement devices to mechanical arms that automatically make contact with the back sides of DUT(s) 340.

Multiple temperature sensors (not shown) may be provided for one or more DUT(s) 340 in order that the temperature uniformity of the DUT 340 can be automatically measured.

Fan Control

An apparatus according to the disclosed subject matter could automatically control the cooling fans (510, 511, 512a, 512b, 513) and/or recirculation valves 514 in order to adjust the airflow rates through the system and maintain a desired temperature setpoint of the DUT(s) 340.

In one embodiment, the airflow rates are adjusted by modifying the speed of one or more of the fans (510, 511, 512a, 512b, 513).

In an alternative embodiment, the airflow rates are adjusted by selecting a variable number of fans (510, 511, 512a, 512b, 513) to turn on. An embodiment employing a variable number of fans is advantageous because of the lower implementation cost compared to speed-controlled fans.

The number of fans and/or the positions of recirculation valves 514 may be selected automatically by software utilizing a proportional-integral-differential (PID) control algorithm, according to methods known in the art.

Light Sensors

An apparatus according to the disclosed subject matter may additionally include one or more light sensor units 552 (not shown) disposed on the target plane(s) 330, for measuring the intensity of the light reaching the target plane(s) 330. The light sensor units 552 (not shown) include a light sensitive device such as a photodiode, which is calibrated against a known reference device. Preferably, the light sensor units 552 (not shown) also include a temperature measurement device, and the calibrated reading of the light sensitive device is adjusted according to the measured temperature of the light sensor unit 552 (not shown) to compensate for temperature induced variations in the response of the light sensitive device.

Preferably, the apparatus contains multiple light sensor units 552 (not shown), so that the light intensity can be measured at multiple locations on the target plane(s) 330 during operation.

In one embodiment, readings from one or more light sensor units 552 (not shown) may be used to automatically adjust the intensities of lamps 310 in order to optimize light intensity and/or uniformity at the target plane(s) 330.

I-V Measurement

The apparatus optionally includes a system for providing an electrical load to and/or measuring the electrical parameters of one or more DUT(s) 340 in conjunction with the light soaking function.

Measured electrical parameters may be automatically logged and/or analyzed, and may be used to determine end-of-test conditions. For example, measured power output of each DUT 340 may be monitored to determine when power output has stabilized, whereupon the light soaking test may be ended or a user may be automatically notified.

In one embodiment, the apparatus includes a load resistor or an electronic load connected to one or more DUT(s) 340.

In another embodiment, the apparatus includes I-V electronics 610 (not shown) for measuring the I-V curve of at least one of and preferably all of the DUT(s) 340. The I-V electronics preferably are capable of measuring I-V curves when the DUT(s) 340 are both illuminated ("light I-V") and not illuminated ("dark I-V"), i.e. with lamps 310 either on or off. Preferably, the I-V electronics 610 (not shown) can also be used as electronic loads which automatically track the maximum power point or other operating point of each DUT 340.

The accuracy of I-V curve measurements may be compromised by noise sources synchronous with the power line cycle. A significant noise source includes oscillations in the light intensity at a DUT 340 associated with ballast 560 "ripple", as discussed previously. This effect may be reduced by using electronic ballasts 560 and/or by assigning neighboring lamps 310 to different phases of a three-phase power system, as discussed previously. However, some effect may remain. Furthermore, electrical noise associated with the large power input to the lamp ballasts 560 and fans (510, 511, 512a, 512b, 513) may also affect the I-V measurements. Therefore, in one embodiment, the I-V electronics 610 may include a circuit for detecting the power line cycle and the I-V electronics 610 may perform data acquisition and/or averaging during periodic time intervals synchronized with the power line cycle. This reduces the effect of any noise sources synchronous with the power line cycle.

Control System

A computer (not shown) controls an I/O subsystem (not shown) which is used for data acquisition and control of other elements. The computer controls the operation of the apparatus; provides a user interface; logs data from sensors and other measurement systems; analyzes data and calculates calibrated measurement values; provides for sequencing of test conditions involving varying light intensities, temperatures, and/or electrical measurements; identifies fault conditions; and performs other beneficial controlling functions.

The computer and I/O subsystem functions may be provided by separate pieces of equipment or by a single piece of equipment. Any of the computer or I/O subsystem functions may be integrated within the apparatus and/or remote to the apparatus. The computer and I/O subsystem may include, for example, a personal computer (PC), an I/O peripheral device, and/or a programmable logic controller (PLC) system.

The apparatus optionally contains a control interface, which may comprise, for example, a display and input terminal of the computer, a miniature human machine interface (HMI) unit, or alternative control interfaces.

Electrical power enters the system at the power entry point (not shown). Optionally, power monitoring circuits (not shown) measure the system power consumption, and these data are compared to expected power consumption to identify system faults, such as inoperative lamps 310.

Computing System

An exemplary computer system for implementing the disclosed subject matter includes a general purpose computing device in the form of a computing system, commercially available from Intel, IBM, AMD, and others. Components of the computing system may include, but are not limited to, a processing unit, a system memory, and a system bus that couples various system components. Computing system typically includes a variety of computer readable media, including both volatile and nonvolatile media, and removable and non-removable media. Computer memory includes, but is not limited to, RAM, ROM, EEPROM, flash memory or other memory technology, CD-ROM, digital versatile disks (DVD) or other optical disk storage, magnetic disks, or any other medium which can be used to store the desired information and which can be accessed by the computing system. A user may enter commands and information into the computing system 900 through input devices such as a keyboard, a mouse, or other interfaces. A monitor or other type of display device may also be connected to the system bus via an interface. The monitor may also be integrated with a touch-screen panel or the like. The computing system may operate in a networked environment using logical connections to one or more remote computers. The remote computing system may be a personal computer, a server, a router, a network PC, a peer device or other common network node, and typically includes many or all of the elements described above relative to the computing system.

Exemplary Embodiment

Figure 15:
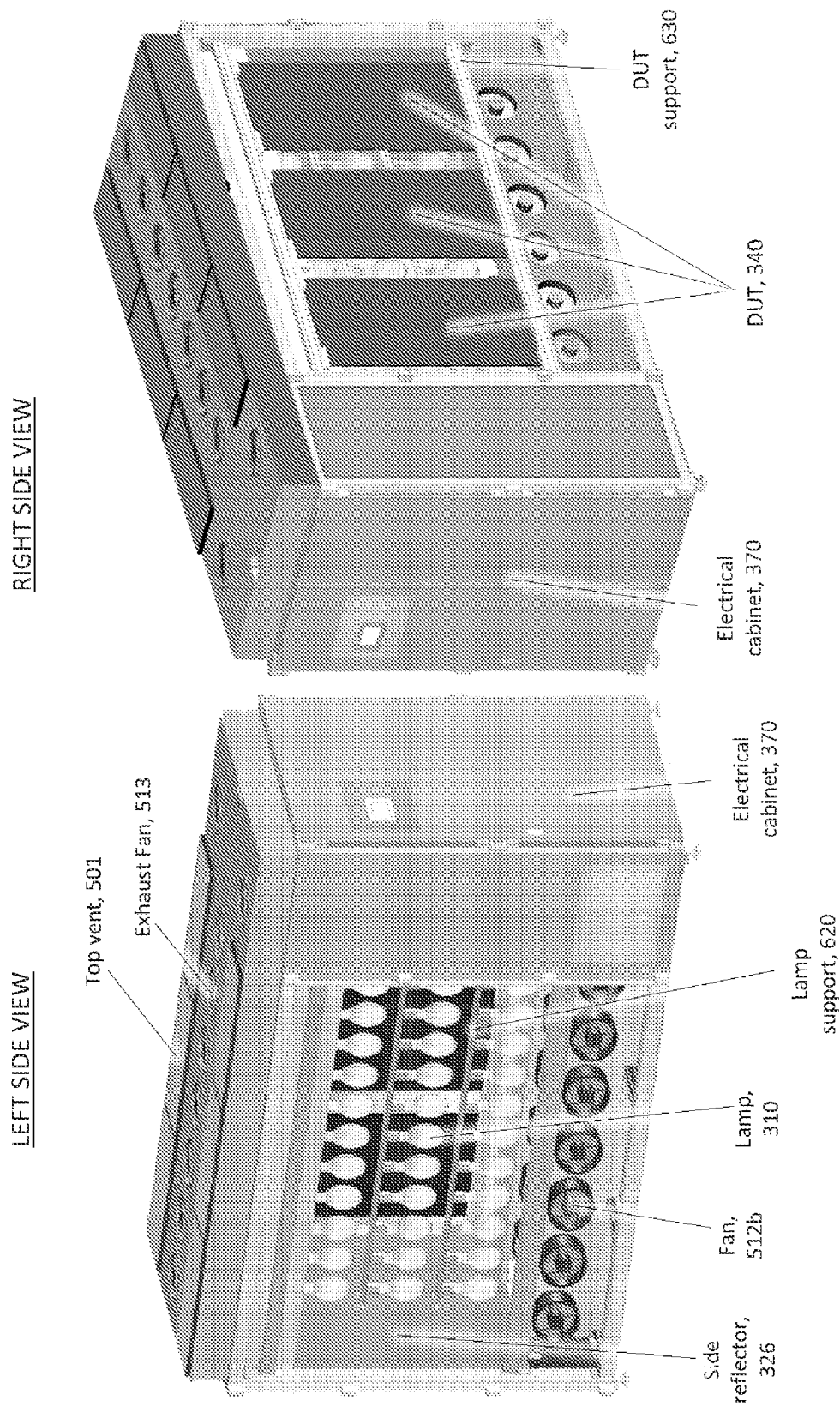
FIG. 15 depicts a cutaway view of an exemplary embodiment according to the disclosed subject matter.

FIG. 15 depicts an exemplary embodiment of the apparatus. The embodiment depicted is similar to that depicted in FIG. 9.

The exemplary embodiment includes two target planes each of which is ~1.4 m high and ~2.26 m wide, allowing the apparatus to accommodate up to six typical 70 W thin-film modules or up to two typical 200-300 W crystalline silicon modules.

The apparatus includes fifty-two 400 W HID metal halide lamps, allowing the apparatus to reach light intensities >1250 W/m². The lamps 310 are arranged in 4 horizontal rows of 13 lamps each, wherein each row of lamps is held by a lamp support rail 620. DUT modules 340, shown on the right side of the apparatus only, are supported by horizontal DUT support rails 630.

Cooling is provided by fans 512b and 513, which draw air through top vents 501 and cool the DUT(s) 340 as described in connection with FIG. 9. The apparatus includes 7 fans 512b on each side of the system and 7 exhaust fans 513 on top of the system. Each of the fans has a maximum airflow capacity of 850 cubic feet per minute (CFM), providing a maximum of up to ~18000 CFM of airflow. At light intensities of ~750-1250 W/m2, this allows the system to maintain DUT 340 temperatures within the range 50-85 C. Each fan is controlled by a solid-state relay. Variable numbers of fans in each group are powered on in a symmetric manner in order to adjust the cooling rate. Top vents 501 contain removable filters.

Electrical wires (not shown) to each lamp 310 are held within wiring trays integrated within support rails 620. Silicone-insulated wires with a temperature rating of >150 C and pulsed voltage rating >5 kV are preferred, due to the high temperatures generated near the lamp sockets and the high voltage generated by the lamp ballasts 560.

Additional Elements

In one embodiment, the apparatus includes a transparent safety shield between the lamps 310 and the target plane(s)

330, to prevent an operator from falling into the lamps 310 or dropping a DUT module 340 into the lamps during loading or unloading of the chamber 300. The safety shield could be constructed, for example, of a coarse wire mesh or a transparent sheet. Glass panels 516 may serve as the safety shield.

In one embodiment, the apparatus includes a transparent diffusing screen between the lamps 310 and the target plane(s) 330, to improve the light uniformity on the target plane(s) 330. The diffusing screen may be integrated with glass panels 516, for example by texturing the glass surface.

In one embodiment, the apparatus includes a filter material between the lamps 310 and the target plane(s) 330, to modify the spectrum of the light falling on the target plane(s) 330. The filter material may be integrated with glass panels 516.

In one embodiment, the apparatus includes two or more types of lamps 310 which have different spectral intensity distributions, wherein the light falling on the target plane(s) 330 is a combination of light from the various lamp types. Individual lamp types may be separately dimmed in order to vary their contributions to the spectrum.

In one embodiment, the apparatus includes reflectors whose reflectance characteristics modify the spectral intensity distribution of the light falling on the target plane(s) 330.

In one embodiment, the apparatus includes a chiller for chilling the cooling air before it contacts the DUT(s) 340. This may be done, for example, by forcing the air that enters any of the inlet vents (480, 480', 500, 501) to first pass through a manifold cooled by chilled water, or by supplying air to these vents from an air chilling system. Other methods of chilling air could also be employed and remain within the scope of this disclosure. Using chilled air provides the ability to cool the DUT(s) 340 to lower temperatures than may be achieved using only room-temperature air. For example, using only room-temperature cooling air, it may be impractical to achieve DUT 340 temperatures much below 40 C while exposing DUT(s) 340 to light intensities of >1000 W/m². Using chilled cooling air, DUT 340 temperatures down to e.g. 20 C can be practically achieved.

Steady-State Solar Simulator

It should be understood that an apparatus according to the disclosed subject matter constitutes a steady-state solar simulator. Although described specifically with reference to "light soaking" applications and as a "light soaking chamber," the invented apparatus may also be used for any other applications of a steady-state solar simulator to which it is well suited.

CONCLUSION

Although example diagrams to implement the elements of the disclosed subject matter have been provided, one skilled in the art, using this disclosure, could develop additional hardware and/or software to practice the disclosed subject matter and each is intended to be included herein.

In addition to the above described embodiments, those skilled in the art will appreciate that this disclosure has application in a variety of arts and situations and this disclosure is intended to include the same.

What is claimed is:

1. An apparatus for exposing photovoltaic (PV) modules to steady-state artificial light in a controlled chamber for the purposes of continuous or extended duration testing of said photovoltaic (PV) modules, comprising:
   at least one substantially vertically oriented target plane for placing at least one PV module;
   at least one reflector for directing the artificial light to impact said at least one target plane; and
   an array of steady-state lamps disposed on a substantially vertically oriented lamp plane, wherein said array extends approximately to the boundary planes perpendicular to the edges of said target plane.

2. The apparatus of claim 1, comprising two vertically oriented target planes, said target planes oriented on opposite sides of said lamp array, and said at least one reflector oriented to direct light from said lamp array to said two target planes.

3. The apparatus of claim 2, further comprising at least one back-reflector disposed substantially parallel to one of the target planes and substantially within or near said target plane, wherein, in the absence of PV modules disposed within said target plane, said back-reflector increases the intensity of light received at the opposite target plane.

4. The apparatus of claim 1, wherein said lamps include mercury, metal halide, xenon, or other high-intensity discharge (HID) arc lamps.

5. The apparatus of claim 1, wherein the intensity of the artificial light received at said target planes is between 750 and 1250 W/m².

6. The apparatus of claim 1, wherein said lamps are powered by electronic ballasts, and wherein said ballasts are individually controllable to dim the light output of each of said lamps independently.

7. The apparatus of claim 1, wherein said ballasts include a power monitoring feature.

8. The apparatus of claim 6, wherein the intensity of each of said lamps is adjusted to optimize the intensity and uniformity of light received at said target planes.

9. The apparatus of claim 8, wherein a predetermined pattern of lamp on/off states and dimming settings is used to optimize uniformity and intensity of light received at said target planes, while maintaining each lamp within a predetermined power output range which optimizes the spectral distribution of light emitted from said lamp.

10. The apparatus of claim 6, wherein the light intensity at at least one point within said target planes is measured, and wherein power to said lamps is automatically adjusted to maintain a pre-determined light intensity level at said at least one point.

11. The apparatus of claim 1, wherein said lamps are powered by a three-phase power system, and wherein said lamps are uniformly distributed between the phases of said three-phase power system, and wherein each group of said lamps powered by each phase of said power system is uniformly distributed throughout said lamp array, such that the artificial light received at substantially each portion of said target planes includes a substantially uniform mixture of light produced by lamps powered by each phase of said three-phase power system.

12. The apparatus of claim 1, wherein multiple types of lamps with different emission spectra are combined within said lamp array.

13. The apparatus of claim 1, wherein at least one diffusing screen is interposed between said lamp array and said target planes to improve light uniformity at said target planes.

14. The apparatus of claim 1, wherein at least one filter material is interposed between said lamp array and said target planes to modify the spectrum of light falling on said target planes.

15. The apparatus of claim 1, wherein said reflectors include vertical and horizontal reflector panels disposed substantially perpendicular to said lamp array along top, bottom, and side planes which enclose said lamp array.

16. The apparatus of claim 15, wherein the distance between said vertical and horizontal reflector panels and the nearest column or row of said lamps, respectively, is less than, respectively, one half the horizontal or vertical spacing between said lamps.

17. The apparatus of claim 1, wherein the distance between said lamp array and said target planes is between 2 and 4 times the distance between individual lamps in said lamp array.

18. The apparatus of claim 1, further comprising a cooling system to maintain a temperature of said PV modules between predetermined limits, by directing cooling air onto said PV modules using cooling fans.

19. The apparatus of claim 18, wherein said temperature is maintained between 45 and 90° C.

20. The apparatus of claim 18, wherein said cooling air flows substantially vertically within said apparatus and further comprising inlet and exhaust vents in the top and/or bottom of said apparatus and wherein said cooling fans draw cooling air through said inlet vents and exhaust it at said exhaust vents.

21. The apparatus of claim 20, further comprising recirculation valves that cause cooling air drawn through said inlet vents to be mixed with heated air drawn from the interior of the apparatus, and wherein the proportions of external and interior cooling air are adjusted to maintain the temperature of cooling air reaching said PV modules at an optimal value.

22. The apparatus of claim 20, further comprising transparent panels interposed between said lamp array and each of said target planes, and wherein cooling air passes vertically between said PV modules and said transparent panels, such that said PV modules are cooled from their front sides facing said lamp array.

23. The apparatus of claim 22, wherein said transparent panel is tilted and constricts the air flow at the top or bottom of said PV modules, changing the cooling effectiveness of said cooling air and compensating for other non-uniformities in cooling.

24. The apparatus of claim 22, wherein said inlet and said exhaust vents are in the top of said apparatus, and wherein said cooling air is drawn downwards across said PV modules.

25. The apparatus of claim 20, wherein air blocking panels fill portions of said target planes not containing said PV modules.

26. The apparatus of claim 25, wherein said cooling air flows along the back sides of said PV modules opposite said lamp array, between said PV modules and at least one door or exterior panel of the apparatus.

27. The apparatus of claim 25, wherein said inlet and said exhaust vents are in the top of said apparatus, and wherein said cooling air is drawn downwards across said PV modules.

28. The apparatus of claim 18, wherein fan vanes interposed between said cooling fans and said PV modules distribute air flow uniformly across said PV modules.

29. The apparatus of claim 18, wherein said PV modules are cooled substantially by cooling air entering the sides of said apparatus, and wherein said cooling air is directed at the back sides of said PV modules opposite said lamp array.

30. The apparatus of claim 29, wherein said cooling fans are disposed at the top and/or bottom of said apparatus, and cause said cooling air to be drawn through side vents behind said PV modules.

31. The apparatus of claim 30, wherein at least one of the size, shape, position, or number of said side vents is arranged to provide non-uniform flow of cooling air to the back sides of said PV modules, compensating for other cooling non-uniformities and resulting in more uniform temperature distributions of said PV modules.

32. The apparatus of claim 31, wherein said side vents include a panel with an array of holes, wherein individual holes are covered or capped with removable plugs to adjust the air flow pattern.

33. The apparatus of claim 31, wherein said side vents include a moveable screen that is adjusted to optimize the air flow pattern.

34. The apparatus of claim 29, wherein said cooling fans are disposed along the sides of said apparatus within doors or exterior panels behind said PV modules, and wherein said cooling fans cause said cooling air to be drawn through side vents and expelled against said PV modules.

35. The apparatus of claim 34, wherein at least one of the size, position, number, or speed of said cooling fans is arranged to provide non-uniform flow of cooling air to the back sides of said PV modules, compensating for other cooling non-uniformities and resulting in more uniform temperature distributions of said PV modules.

36. The apparatus of claim 18, wherein groups of cooling fans are turned on or off in symmetric arrangements in order to achieve progressively greater levels of cooling.

37. The apparatus of claim 18, wherein the cooling rate is controlled by a proportional-integral-differential (PID) control loop in order to maintain a temperature between predetermined limits.

38. The apparatus of claim 18, wherein the air flow direction is periodically alternated or reversed in order to achieve more uniform temperatures of said PV modules.

39. The apparatus of claim 18, wherein cooling air is admitted to said apparatus through inlet ducts and/or exhausted air is removed from said apparatus through exhaust ducts.

40. The apparatus of claim 39, wherein an air-chilling system is used to provide chilled air via the inlet ducts.

41. The apparatus of claim 18, further comprising an additional cooling system to independently cool said lamp array.

42. The apparatus of claim 1, further comprising at least one temperature sensor to measure at least one temperature of said PV modules.

43. The apparatus of claim 42, wherein said temperature sensors include an infrared temperature sensor mounted within doors of said apparatus, and wherein said infrared temperature sensor is automatically directed at at least one of said PV modules.

44. The apparatus of claim 1, further comprising at least one light sensor for measuring the intensity of the light reaching at least one point of said target planes.

45. The apparatus of claim 44, wherein said light sensor comprises a light sensitive device and a temperature sensor which measures the temperature of said light sensitive device, and wherein said temperature reading is used to calculate temperature-compensated calibrated values of light intensity from measurements of said light sensitive device.

46. The apparatus of claim 1, further comprising an electronic system for measuring the current-voltage relationships ("I-V system") of at least one of said PV modules.

47. The apparatus of claim 46, wherein said I-V system may continuously dissipate power produced by said PV modules.

48. The apparatus of claim 46, wherein data acquisition by said I-V system is performed during periodic time intervals synchronous with the power line cycle.

49. The apparatus of claim 1, further comprising at least one computer system, wherein said computer system controls operation of the apparatus, logs and analyzes data collected by sensors and measurement electronics, provides for sequencing of test conditions, and/or monitors and reports fault conditions.

50. The apparatus of claim 49, wherein said at least one computer system is remote from the apparatus.

\* \* \* \* \*